(12) United States Patent
Kameda et al.

(10) Patent No.: US 12,080,671 B2
(45) Date of Patent: Sep. 3, 2024

(54) LAYERED BONDING MATERIAL, SEMICONDUCTOR PACKAGE, AND POWER MODULE

(71) Applicant: SENJU METAL INDUSTRY CO., LTD., Tokyo (JP)

(72) Inventors: Naoto Kameda, Tokyo (JP); Kanta Dei, Tokyo (JP); Masato Tsuchiya, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 18/288,636

(22) PCT Filed: Apr. 18, 2022

(86) PCT No.: PCT/JP2022/017980
§ 371 (c)(1),
(2) Date: Oct. 27, 2023

(87) PCT Pub. No.: WO2022/230697
PCT Pub. Date: Nov. 3, 2022

(65) Prior Publication Data
US 2024/0213206 A1 Jun. 27, 2024

(30) Foreign Application Priority Data
Apr. 28, 2021 (JP) .................... 2021-076312

(51) Int. Cl.
*H01L 23/00* (2006.01)
*B23K 1/00* (2006.01)
(Continued)

(52) U.S. Cl.
CPC ............ *H01L 24/29* (2013.01); *B23K 1/0016* (2013.01); *B32B 15/01* (2013.01); *H01L 24/32* (2013.01);
(Continued)

(58) Field of Classification Search
CPC ..................... H01L 24/29; H01L 24/03; H01L 2224/32225; B23K 1/0016;
(Continued)

(56) References Cited

U.S. PATENT DOCUMENTS 10,727,167 B2 * 7/2020 Yamada ................. H01L 29/12
2006/0151889 A1 7/2006 Kajiwara et al.
(Continued)

FOREIGN PATENT DOCUMENTS

CN 102194784 9/2011
CN 105195914 12/2015
(Continued)

OTHER PUBLICATIONS

Written Opinion of the International Searching Authority issued Jun. 28, 2022, in International Application No. PCT/JP2022/017980, with English translation.
(Continued)

*Primary Examiner* — Jasmine J Clark
(74) *Attorney, Agent, or Firm* — Wenderoth, Lind & Ponack, L.L.P.

(57) ABSTRACT

A layered bonding material 10 includes a base material 11, a first solder section 12a stacked on a first surface of the base material 11, and a second solder section 12b stacked on a second surface of the base material 11. A coefficient of linear expansion of the base material 11 is 5.5 to 15.5 ppm/K, the first solder section 12a and the second solder section 12b are made of lead-free solder, and both of a thickness of the first solder section 12a and a thickness of the second solder section 12b are 0.05 to 1.0 mm.

18 Claims, 15 Drawing Sheets

(51) Int. Cl.
  B23K 101/40     (2006.01)
  B23K 103/12     (2006.01)
  B23K 103/16     (2006.01)
  B32B 15/01      (2006.01)

(52) U.S. Cl.
  CPC ...... *B23K 2101/40* (2018.08); *B23K 2103/12* (2018.08); *B23K 2103/166* (2018.08); *H01L 2224/29083* (2013.01); *H01L 2224/29111* (2013.01); *H01L 2224/29147* (2013.01); *H01L 2224/29155* (2013.01); *H01L 2224/2918* (2013.01); *H01L 2224/29184* (2013.01); *H01L 2224/32225* (2013.01)

(58) Field of Classification Search
  CPC ............ B23K 2101/40; B23K 2103/12; B23K 2103/166; B32B 15/01
  USPC ........................................................ 257/668
  See application file for complete search history.

(56)            References Cited

U.S. PATENT DOCUMENTS

| | | |
|---|---|---|
| 2008/0122050 A1 | 5/2008 | Ikeda et al. |
| 2011/0198755 A1 | 8/2011 | Maeda et al. |
| 2011/0221076 A1 | 9/2011 | Takayama et al. |
| 2013/0134591 A1 | 5/2013 | Sakamoto et al. |
| 2022/0281035 A1 | 9/2022 | Nishimura et al. |

FOREIGN PATENT DOCUMENTS

| | | |
|---|---|---|
| JP | 2003-204020 | 7/2003 |
| JP | 2009-147111 | 7/2009 |
| JP | 2009-269075 | 11/2009 |
| JP | 2011-139000 | 7/2011 |
| JP | 2012-35291 | 2/2012 |
| JP | 2013-128065 | 6/2013 |
| JP | 5285079 | 6/2013 |
| JP | 2015-23183 | 2/2015 |
| JP | 2015-133396 | 7/2015 |
| KP | 10-2006-0081368 | 7/2006 |
| WO | 2005/124850 | 12/2005 |
| WO | 2009/098865 | 8/2009 |
| WO | 2016/079881 | 5/2016 |
| WO | 2021/025081 | 2/2021 |

OTHER PUBLICATIONS

English language translation of Office Action issued Jan. 18, 2024 in corresponding Korean Patent Application No. 10-2023-7040413.
International Search Report issued Jun. 28, 2022 in International (PCT) Application No. PCT/JP2022/017980.
Notice of Reasons for Refusal issued Mar. 26, 2024 in corresponding Japanese Patent Application No. 2023-517449, with English language translation.
Office Action issued Jun. 6, 2024 in Chinese Application No. 202280030517.8, with English translation.

* cited by examiner

FIG. 3A

| | BASE MATERIAL | COEFFICIENT OF LINEAR EXPANSION OF BASE MATERIAL [ppm/K] | THERMAL CONDUCTIVITY OF BASE MATERIAL [W/(m·K)] | THICKNESS OF BASE MATERIAL [mm] | SOLDER | THICKNESS OF SOLDER [mm] | CRACK PROGRESS RATIO |
|---|---|---|---|---|---|---|---|
| EXAMPLE 1 | 15Cu-85W | 7.0 | 184 | 0.20 | 3.0Ag-0.5Cu-SnBal. | 0.05 | ○ |
| EXAMPLE 2 | 30Cu-70Mo | 7.7 | 195 | 0.20 | 3.0Ag-0.5Cu-SnBal. | 0.05 | ◎ |
| EXAMPLE 3 | 50Cu-50Mo | 9.9 | 252 | 0.20 | 3.0Ag-0.5Cu-SnBal. | 0.05 | ○ |
| EXAMPLE 4 | 15Cu-85W | 7.0 | 184 | 0.20 | 3.0Ag-0.5Cu-SnBal. | 0.10 | ○ |
| EXAMPLE 5 | 30Cu-70Mo | 7.7 | 195 | 0.20 | 3.0Ag-0.5Cu-SnBal. | 0.10 | ○ |
| EXAMPLE 6 | 50Cu-50Mo | 9.9 | 252 | 0.20 | 3.0Ag-0.5Cu-SnBal. | 0.10 | ○ |
| EXAMPLE 7 | 30Cu-70Mo | 7.7 | 195 | 0.20 | 10.0Ag-4.0Cu-20.0Sb-SnBal. | 0.05 | ◎ |
| EXAMPLE 8 | 50Cu-50Mo | 9.9 | 252 | 0.20 | 10.0Ag-4.0Cu-20.0Sb-SnBal. | 0.05 | ◎ |
| EXAMPLE 9 | 30Cu-70Mo | 7.7 | 195 | 0.20 | 10.0Ag-4.0Cu-20.0Sb-SnBal. | 0.10 | ◎ |
| EXAMPLE 10 | 50Cu-50Mo | 9.9 | 252 | 0.20 | 10.0Ag-4.0Cu-20.0Sb-SnBal. | 0.10 | ◎ |

FIG. 3B

| | BASE MATERIAL | COEFFICIENT OF LINEAR EXPANSION OF BASE MATERIAL [ppm/K] | THERMAL CONDUCTIVITY OF BASE MATERIAL [W/(m·K)] | THICKNESS OF BASE MATERIAL [mm] | SOLDER | THICKNESS OF SOLDER [mm] | CRACK PROGRESS RATIO |
|---|---|---|---|---|---|---|---|
| EXAMPLE 11 | 6Cu-94W | 5.9 | 141 | 0.20 | 3.0Ag-0.5Cu-SnBal. | 0.05 | ○ |
| EXAMPLE 12 | 10Cu-90W | 6.5 | 174 | 0.20 | 3.0Ag-0.5Cu-SnBal. | 0.05 | ○ |
| EXAMPLE 13 | 20Cu-80W | 7.9 | 200 | 0.20 | 3.0Ag-0.5Cu-SnBal. | 0.05 | ◎ |
| EXAMPLE 14 | 30Cu-70W | 9.4 | 251 | 0.20 | 3.0Ag-0.5Cu-SnBal. | 0.05 | ○ |
| EXAMPLE 15 | 15Cu-85Mo | 6.8 | 146 | 0.20 | 3.0Ag-0.5Cu-SnBal. | 0.05 | ○ |
| EXAMPLE 16 | 35Cu-65Mo | 8.2 | 210 | 0.20 | 3.0Ag-0.5Cu-SnBal. | 0.05 | ◎ |
| EXAMPLE 17 | 40Cu-60Mo | 8.8 | 220 | 0.20 | 3.0Ag-0.5Cu-SnBal. | 0.05 | ○ |
| EXAMPLE 18 | 60Cu-40Mo | 11.5 | 275 | 0.20 | 3.0Ag-0.5Cu-SnBal. | 0.05 | ○ |
| EXAMPLE 19 | Cu/30Cu-70Mo/Cu (RATIO OF THICKNESS 1:4:1) | 7.7 | 200 | 0.20 | 3.0Ag-0.5Cu-SnBal. | 0.05 | ◎ |
| EXAMPLE 20 | Cu/30Cu-70Mo/Cu (RATIO OF THICKNESS 2:3:2) | 10.6 | 235 | 0.20 | 3.0Ag-0.5Cu-SnBal. | 0.05 | ○ |
| EXAMPLE 21 | Cu/30Cu-70Mo/Cu (RATIO OF THICKNESS 1:1:1) | 11.6 | 260 | 0.20 | 3.0Ag-0.5Cu-SnBal. | 0.05 | ○ |
| EXAMPLE 22 | Cu/30Cu-70Mo/Cu (RATIO OF THICKNESS 2:1:2) | 14.4 | 300 | 0.20 | 3.0Ag-0.5Cu-SnBal. | 0.05 | ○ |
| EXAMPLE 23 | Cu/50Cu-50Mo/Cu (RATIO OF THICKNESS 1:1:1) | 13.8 | 300 | 0.20 | 3.0Ag-0.5Cu-SnBal. | 0.05 | ○ |

FIG. 4

| | BASE MATERIAL | COEFFICIENT OF LINEAR EXPANSION OF BASE MATERIAL (ppm/K) | THERMAL CONDUCTIVITY OF BASE MATERIAL (W/(m·K)) | THICKNESS OF BASE MATERIAL (mm) | SOLDER | THICKNESS OF SOLDER (mm) | CRACK PROGRESS RATIO |
|---|---|---|---|---|---|---|---|
| COMPARATIVE EXAMPLE 1 | 100Cu | 17.1 | 394 | 0.20 | 3.0Ag-0.5Cu-SnBal. | 0.02 | × |
| COMPARATIVE EXAMPLE 2 | 15Cu-85W | 7.0 | 184 | 0.20 | 3.0Ag-0.5Cu-SnBal. | 0.02 | × |
| COMPARATIVE EXAMPLE 3 | 30Cu-70Mo | 7.7 | 195 | 0.20 | 3.0Ag-0.5Cu-SnBal. | 0.02 | × |
| COMPARATIVE EXAMPLE 4 | 50Cu-50Mo | 9.9 | 252 | 0.20 | 3.0Ag-0.5Cu-SnBal. | 0.02 | × |
| COMPARATIVE EXAMPLE 5 | W | 4.6 | 142 | 0.20 | 3.0Ag-0.5Cu-SnBal. | 0.05 | × |
| COMPARATIVE EXAMPLE 6 | Mo | 5.2 | 167 | 0.20 | 3.0Ag-0.5Cu-SnBal. | 0.05 | × |
| COMPARATIVE EXAMPLE 7 | NONE | - | - | - | 3.0Ag-0.5Cu-SnBal. | 0.30 | × |
| COMPARATIVE EXAMPLE 8 | 100Cu | 17.1 | 394 | 0.20 | 3.0Ag-0.5Cu-SnBal. | 0.05 | × |
| COMPARATIVE EXAMPLE 9 | NONE | - | - | - | 3.0Ag-0.5Cu-SnBal. | 0.40 | × |
| COMPARATIVE EXAMPLE 10 | 100Cu | 17.1 | 394 | 0.20 | 3.0Ag-0.5Cu-SnBal. | 0.10 | × |
| COMPARATIVE EXAMPLE 11 | 100Cu | 17.1 | 394 | 0.20 | 10.0Ag-4.0Cu-20.0Sb-SnBal. | 0.02 | × |
| COMPARATIVE EXAMPLE 12 | 15Cu-85W | 7.0 | 184 | 0.20 | 10.0Ag-4.0Cu-20.0Sb-SnBal. | 0.02 | × |
| COMPARATIVE EXAMPLE 13 | 30Cu-70Mo | 7.7 | 195 | 0.20 | 10.0Ag-4.0Cu-20.0Sb-SnBal. | 0.02 | × |
| COMPARATIVE EXAMPLE 14 | 50Cu-50Mo | 9.9 | 252 | 0.20 | 10.0Ag-4.0Cu-20.0Sb-SnBal. | 0.02 | × |
| COMPARATIVE EXAMPLE 15 | NONE | - | - | - | 10.0Ag-4.0Cu-20.0Sb-SnBal. | 0.30 | × |
| COMPARATIVE EXAMPLE 16 | 100Cu | 17.1 | 394 | 0.20 | 10.0Ag-4.0Cu-20.0Sb-SnBal. | 0.05 | × |
| COMPARATIVE EXAMPLE 17 | NONE | - | - | - | 10.0Ag-4.0Cu-20.0Sb-SnBal. | 0.40 | × |
| COMPARATIVE EXAMPLE 18 | 100Cu | 17.1 | 394 | 0.20 | 10.0Ag-4.0Cu-20.0Sb-SnBal. | 0.10 | × |

FIG. 8A

| | BASE MATERIAL | COEFFICIENT OF LINEAR EXPANSION OF BASE MATERIAL [ppm/K] | THERMAL CONDUCTIVITY OF BASE MATERIAL [W/(m·K)] | THICKNESS OF BASE MATERIAL [mm] | SOLDER | TENSILE STRENGTH OF SOLDER [MPa] | YOUNG'S MODULUS OF SOLDER [GPa] | FIRST SOLDER SECTION THICKNESS [mm] | SECOND SOLDER SECTION THICKNESS [mm] | CRACK PROGRESS RATIO |
|---|---|---|---|---|---|---|---|---|---|---|
| EXAMPLE B1 | 15Cu-85W | 7.0 | 184 | 0.20 | 3.4Ag-0.7Cu-3.2Bi-3.0Sb-0.025Fe-0.008Co-SnBal. | 96.5 | 48.1 | 0.05 | 0.05 | C |
| EXAMPLE B2 | 15Cu-85W | 7.0 | 184 | 0.20 | 3.4Ag-0.7Cu-3.2Bi-3.0Sb-0.025Fe-0.008Co-SnBal. | 96.5 | 48.1 | 0.10 | 0.10 | C |
| EXAMPLE B3 | 30Cu-70Mo | 7.7 | 195 | 0.20 | 3.4Ag-0.7Cu-3.2Bi-3.0Sb-0.025Fe-0.008Co-SnBal. | 96.5 | 48.1 | 0.05 | 0.05 | B |
| EXAMPLE B4 | 30Cu-70Mo | 7.7 | 195 | 0.20 | 3.4Ag-0.7Cu-3.2Bi-3.0Sb-0.025Fe-0.008Co-SnBal. | 96.5 | 48.1 | 0.10 | 0.10 | B |
| EXAMPLE B5 | 50Cu-50Mo | 9.9 | 252 | 0.20 | 3.4Ag-0.7Cu-3.2Bi-3.0Sb-0.025Fe-0.008Co-SnBal. | 96.5 | 48.1 | 0.05 | 0.05 | A |
| EXAMPLE B6 | 50Cu-50Mo | 9.9 | 252 | 0.20 | 3.4Ag-0.7Cu-3.2Bi-3.0Sb-0.025Fe-0.008Co-SnBal. | 96.5 | 48.1 | 0.10 | 0.10 | A |
| EXAMPLE B7 | 15Cu-85W | 7.0 | 184 | 0.20 | 10.0Sb-SnBal. | 58.1 | 53.8 | 0.05 | 0.05 | B |
| EXAMPLE B8 | 15Cu-85W | 7.0 | 184 | 0.20 | 10.0Sb-SnBal. | 58.1 | 53.8 | 0.10 | 0.10 | C |
| EXAMPLE B9 | 30Cu-70Mo | 7.7 | 195 | 0.20 | 10.0Sb-SnBal. | 58.1 | 53.8 | 0.05 | 0.05 | B |
| EXAMPLE B10 | 30Cu-70Mo | 7.7 | 195 | 0.20 | 10.0Sb-SnBal. | 58.1 | 53.8 | 0.10 | 0.10 | B |
| EXAMPLE B11 | 50Cu-50Mo | 9.9 | 252 | 0.20 | 10.0Sb-SnBal. | 58.1 | 53.8 | 0.05 | 0.05 | A |
| EXAMPLE B12 | 50Cu-50Mo | 9.9 | 252 | 0.20 | 10.0Sb-SnBal. | 58.1 | 53.8 | 0.10 | 0.10 | A |
| EXAMPLE B13 | 15Cu-85W | 7.0 | 184 | 0.20 | 3.0Ag-0.5Cu-SnBal. | 53.3 | 50.0 | 0.05 | 0.05 | C |
| EXAMPLE B14 | 15Cu-85W | 7.0 | 184 | 0.20 | 3.0Ag-0.5Cu-SnBal. | 53.3 | 50.0 | 0.10 | 0.10 | B |
| EXAMPLE B15 | 30Cu-70Mo | 7.7 | 195 | 0.20 | 3.0Ag-0.5Cu-SnBal. | 53.3 | 50.0 | 0.05 | 0.05 | B |
| EXAMPLE B16 | 30Cu-70Mo | 7.7 | 195 | 0.20 | 3.0Ag-0.5Cu-SnBal. | 53.3 | 50.0 | 0.10 | 0.10 | B |
| EXAMPLE B17 | 50Cu-50Mo | 9.9 | 252 | 0.20 | 3.0Ag-0.5Cu-SnBal. | 53.3 | 50.0 | 0.05 | 0.05 | C |
| EXAMPLE B18 | 50Cu-50Mo | 9.9 | 252 | 0.20 | 3.0Ag-0.5Cu-SnBal. | 53.3 | 50.0 | 0.10 | 0.10 | C |
| EXAMPLE B19 | 15Cu-85W | 7.0 | 184 | 0.20 | 0.7Cu-0.06Ni-0.003P-SnBal. | 36.6 | 56.5 | 0.05 | 0.05 | B |
| EXAMPLE B20 | 15Cu-85W | 7.0 | 184 | 0.20 | 0.7Cu-0.06Ni-0.003P-SnBal. | 36.6 | 56.5 | 0.10 | 0.10 | B |
| EXAMPLE B21 | 30Cu-70Mo | 7.7 | 195 | 0.20 | 0.7Cu-0.06Ni-0.003P-SnBal. | 36.6 | 56.5 | 0.05 | 0.05 | A |
| EXAMPLE B22 | 30Cu-70Mo | 7.7 | 195 | 0.20 | 0.7Cu-0.06Ni-0.003P-SnBal. | 36.6 | 56.5 | 0.10 | 0.10 | A |
| EXAMPLE B23 | 50Cu-50Mo | 9.9 | 252 | 0.20 | 0.7Cu-0.06Ni-0.003P-SnBal. | 36.6 | 56.5 | 0.05 | 0.05 | A |
| EXAMPLE B24 | 50Cu-50Mo | 9.9 | 252 | 0.20 | 0.7Cu-0.06Ni-0.003P-SnBal. | 36.6 | 56.5 | 0.10 | 0.10 | A |

FIG. 8B

| | BASE MATERIAL | COEFFICIENT OF LINEAR EXPANSION OF BASE MATERIAL [ppm/K] | THERMAL CONDUCTIVITY OF BASE MATERIAL [W/(m·K)] | THICKNESS OF BASE MATERIAL [mm] | SOLDER | TENSILE STRENGTH OF SOLDER [MPa] | YOUNG'S MODULUS OF SOLDER [GPa] | FIRST SOLDER SECTION THICKNESS [mm] | SECOND SOLDER SECTION THICKNESS [mm] | CRACK PROGRESS RATIO |
|---|---|---|---|---|---|---|---|---|---|---|
| EXAMPLE B25 | 15Cu-85W | 7.0 | 184 | 0.20 | 3.4Ag-0.7Cu-5.0Bi-5.0Sb-0.04Ni-0.008Co-SnBal. | 109.4 | 48.4 | 0.05 | 0.05 | D |
| EXAMPLE B26 | 15Cu-85W | 7.0 | 184 | 0.20 | 3.4Ag-0.7Cu-5.0Bi-5.0Sb-0.04Ni-0.008Co-SnBal. | 109.4 | 48.4 | 0.10 | 0.10 | D |
| EXAMPLE B27 | 30Cu-70Mo | 7.7 | 195 | 0.20 | 3.4Ag-0.7Cu-5.0Bi-5.0Sb-0.04Ni-0.008Co-SnBal. | 109.4 | 48.4 | 0.05 | 0.05 | C |
| EXAMPLE B28 | 30Cu-70Mo | 7.7 | 195 | 0.20 | 3.4Ag-0.7Cu-5.0Bi-5.0Sb-0.04Ni-0.008Co-SnBal. | 109.4 | 48.4 | 0.10 | 0.10 | C |
| EXAMPLE B29 | 50Cu-50Mo | 9.9 | 252 | 0.20 | 3.4Ag-0.7Cu-5.0Bi-5.0Sb-0.04Ni-0.008Co-SnBal. | 109.4 | 48.4 | 0.05 | 0.05 | D |
| EXAMPLE B30 | 50Cu-50Mo | 9.9 | 252 | 0.20 | 3.4Ag-0.7Cu-5.0Bi-5.0Sb-0.04Ni-0.008Co-SnBal. | 109.4 | 48.4 | 0.10 | 0.10 | D |
| EXAMPLE B31 | 15Cu-85W | 7.0 | 184 | 0.20 | 10.0Ag-4.0Cu-20.0Sb-SnBal. | 108.8 | 58.5 | 0.05 | 0.05 | D |
| EXAMPLE B32 | 15Cu-85W | 7.0 | 184 | 0.20 | 10.0Ag-4.0Cu-20.0Sb-SnBal. | 108.8 | 58.5 | 0.10 | 0.10 | D |
| EXAMPLE B33 | 30Cu-70Mo | 7.7 | 195 | 0.20 | 10.0Ag-4.0Cu-20.0Sb-SnBal. | 108.8 | 58.5 | 0.05 | 0.05 | B |
| EXAMPLE B34 | 30Cu-70Mo | 7.7 | 195 | 0.20 | 10.0Ag-4.0Cu-20.0Sb-SnBal. | 108.8 | 58.5 | 0.10 | 0.10 | D |
| EXAMPLE B35 | 50Cu-50Mo | 9.9 | 252 | 0.20 | 10.0Ag-4.0Cu-20.0Sb-SnBal. | 108.8 | 58.5 | 0.05 | 0.05 | D |
| EXAMPLE B36 | 50Cu-50Mo | 9.9 | 252 | 0.20 | 10.0Ag-4.0Cu-20.0Sb-SnBal. | 108.8 | 58.5 | 0.10 | 0.10 | D |

FIG. 10A

| | BASE MATERIAL | THICKNESS OF BASE MATERIAL [mm] | PLANAR SHAPE OF BASE MATERIAL | SOLDER | THICKNESS OF SOLDER [mm] | CTE OF SOLDER [ppm/K] | YOUNG'S MODULUS OF SOLDER [GPa] | TENSILE STRENGTH OF SOLDER [MPa] |
|---|---|---|---|---|---|---|---|---|
| SAMPLE 1 | 50Cu-50Mo | 0.2 | SOLID STATE | 3.0Ag-0.5Cu-SnBal. | 0.02 | 21.7 | 50.0 | 53.0 |
| SAMPLE 2 | NONE | - | - | 3.0Ag-0.5Cu-SnBal. | 0.24 | 21.7 | 50.0 | 53.0 |
| SAMPLE 3 | 50Cu-50Mo | 0.2 | SOLID STATE | 3.0Ag-0.5Cu-SnBal. | 0.05 | 21.7 | 50.0 | 53.0 |
| SAMPLE 4 | 50Cu-50Mo | 0.2 | SOLID STATE | 3.0Ag-0.5Cu-SnBal. | 0.1 | 21.7 | 50.0 | 53.0 |
| SAMPLE 5 | 50Cu-50Mo | 0.2 | SOLID STATE | 3.0Ag-0.5Cu-SnBal. | 0.2 | 21.7 | 50.0 | 53.0 |
| SAMPLE 6 | 50Cu-50Mo | 0.2 | SOLID STATE | 3.0Ag-0.5Cu-SnBal. | 0.4 | 21.7 | 50.0 | 53.0 |
| SAMPLE 7 | 50Cu-50Mo | 0.2 | SOLID STATE | 3.0Ag-0.5Cu-SnBal. | 0.6 | 21.7 | 50.0 | 53.0 |
| SAMPLE 8 | 50Cu-50Mo | 0.2 | SOLID STATE | 3.0Ag-0.5Cu-SnBal. | 0.8 | 21.7 | 50.0 | 53.0 |
| SAMPLE 9 | 50Cu-50Mo | 0.2 | SOLID STATE | 3.0Ag-0.5Cu-SnBal. | 1.0 | 21.7 | 50.0 | 53.0 |
| SAMPLE 10 | 50Cu-50Mo | 0.2 | SOLID STATE | 100Sn | 0.02 | 25.2 | 49.9 | 16.6 |
| SAMPLE 11 | 50Cu-50Mo | 0.2 | SOLID STATE | 10.0Sb-SnBal. | 0.02 | 23.2 | 53.8 | 58.1 |
| SAMPLE 12 | 50Cu-50Mo | 0.2 | SOLID STATE | 10.0Ag-4.0Cu-20.0Sb-SnBal. | 0.02 | 18.6 | 59.0 | 109.0 |
| SAMPLE 13 | 50Cu-50Mo | 0.2 | SOLID STATE | 10.0Ag-4.0Cu-20.0Sb-SnBal. | 0.1 | 18.6 | 59.0 | 109.0 |

FIG. 10B

| | BASE MATERIAL | THICKNESS OF BASE MATERIAL [mm] | PLANAR SHAPE OF BASE MATERIAL | LATTICE INTERVAL [mm] | SOLDER | THICKNESS OF SOLDER [mm] |
|---|---|---|---|---|---|---|
| SAMPLE 14 | 50Cu-50Mo | 0.2 | MESH STATE | 0.5 | 3.0Ag-0.5Cu-SnBal. | 0.02 |
| SAMPLE 15 | 50Cu-50Mo | 0.2 | MESH STATE | 0.5 | 3.0Ag-0.5Cu-SnBal. | 0.1 |
| SAMPLE 16 | 50Cu-50Mo | 0.2 | MESH STATE | 0.5 | 10.0Ag-4.0Cu-20.0Sb-SnBal. | 0.1 |
| SAMPLE 17 | 50Cu-50Mo | 0.2 | MESH STATE | 2.0 | 3.0Ag-0.5Cu-SnBal. | 0.02 |
| SAMPLE 18 | 50Cu-50Mo | 0.2 | MESH STATE | 2.0 | 3.0Ag-0.5Cu-SnBal. | 0.1 |
| SAMPLE 19 | 50Cu-50Mo | 0.2 | MESH STATE | 2.0 | 10.0Ag-4.0Cu-20.0Sb-SnBal. | 0.1 |
| SAMPLE 20 | 50Cu-50Mo | 0.2 | MESH STATE | 3.0 | 3.0Ag-0.5Cu-SnBal. | 0.02 |
| SAMPLE 21 | 50Cu-50Mo | 0.2 | MESH STATE | 3.0 | 3.0Ag-0.5Cu-SnBal. | 0.1 |
| SAMPLE 22 | 50Cu-50Mo | 0.2 | MESH STATE | 5.0 | 3.0Ag-0.5Cu-SnBal. | 0.02 |
| SAMPLE 23 | 50Cu-50Mo | 0.2 | MESH STATE | 5.0 | 3.0Ag-0.5Cu-SnBal. | 0.1 |

FIG. 11

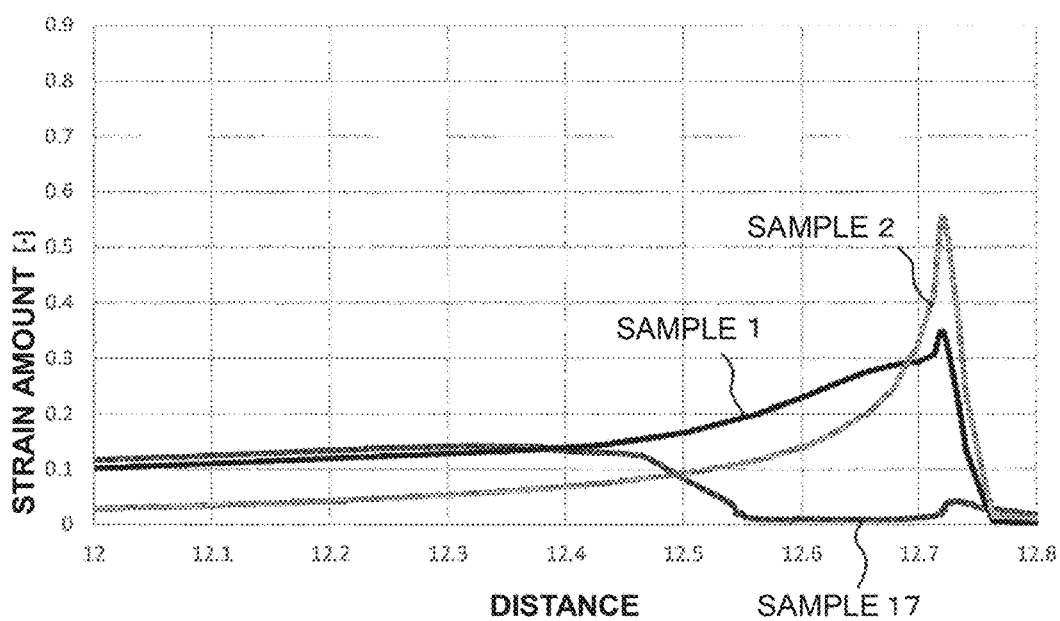

LAYERED BONDING MATERIAL, SEMICONDUCTOR PACKAGE, AND POWER MODULE

TECHNICAL FIELD

The present technique relates to a layered bonding material, a semiconductor package, and a power module.

BACKGROUND ART

Recently, required characteristics of semiconductor devices have become higher. SiC, GaAs, GaN, and the like are used in addition to Si, which has been used as a material of semiconductor devices. Semiconductor devices made of these materials have excellent characteristics including a rise in an operating temperature and expanded bandgaps. The semiconductor devices are applied to power semiconductor devices such as a power transistor.

The power semiconductor devices are capable of performing a high-temperature operation. The temperature of a solder joint in a bonding section sometimes reaches high temperature equal to or higher than 200° C. Under such a high-temperature environment, there is a problem in that a strain due to a difference between CTEs (Coefficients of Thermal Expansion) of a semiconductor device and a substrate occurs in a bonding section between the semiconductor device and the substrate, a crack occurs from the strain, and, as a result, the life of the power semiconductor product is reduced.

Japanese Patent Laid-Open No. 2009-269075 describes a manufacturing method for a layered solder material including soft Pb or Pb-based alloy as a stress relaxation layer. However, since the stress relaxation layer contains Pb, the manufacturing method does not conform to environmental regulations such as a RoHS (Restriction of Hazardous Substances).

Japanese Patent Laid-Open No. 2015-23183 describes a power module including a semiconductor device, a first metal layer formed with one surface bonded to the semiconductor device, an organic insulating film that is in contact with the semiconductor device and formed in an outer circumference peripheral section of the other surface of the first metal layer, a second metal layer that is in contact with the organic insulating film and is formed to be bonded to the center of the other surface of the first metal layer, and a bonding material formed to be bonded to the other surface of the first metal layer via the second metal layer.

Japanese Patent Laid-Open No. 2009-147111 describes a bonding material obtained by stacking surface layers on upper and lower surfaces of a plate-like center layer, the center layer having a melting point higher than a melting point of the surface layers. As specific examples of the center layer, a single phase of bismuth or an alloy with silver, copper, antimony, indium, tin, nickel, germanium, tellurium, or phosphorus containing bismuth as a main component is described.

SUMMARY OF INVENTION

As a result of, while conforming to environmental regulations such as the RoHS, repeating intensive studies in order to find a technique that can relax a strain that occurs in a bonding section, the present inventors came to know that a strain that occurs in the bonding section due to a CTE difference between a semiconductor device and a substrate can be relaxed by using a material having a coefficient of thermal expansion within a predetermined range as a core material while adopting lead-free solder as solder of the bonding section. Further, the inventors came to know that it is possible to improve a stress relaxation effect by limiting thickness and a material of the lead-free solder, a shape of a base material, and the like to specific ones in such a bonding section and, as a result, it is possible to greatly extend the life of a product compared with the related art.

It is desired to provide a layered bonding material, a semiconductor package, and a power module that can relax a strain that occurs in a bonding section, in particular, under a high-temperature environment.

A layered bonding material according to an embodiment includes: a base material; a first solder section stacked on a first surface of the base material; and a second solder section stacked on a second surface of the base material. A coefficient of linear expansion of the base material is 5.5 to 15.5 ppm/K, the first solder section and the second solder section are made of lead-free solder, and both of a thickness of the first solder section and a thickness of the second solder section are 0.05 to 1.0 mm.

BRIEF DESCRIPTION OF DRAWINGS

FIG. 3A is a table showing the configuration of a bonding member used in a first thermal cycle test.

FIG. 3B is a table showing the configuration of the bonding member used in the first thermal cycle test.

FIG. 4 is a table showing the configuration of the bonding member used in the first thermal cycle test.

FIG. 8A is a table showing the configuration of a bonding member used in a second thermal cycle test.

FIG. 8B is a table showing the configuration of the bonding member used in the second thermal cycle test.

FIG. 10A is a table showing the configurations of samples 1 to 13 used in a stress analysis simulation.

FIG. 10B is a table showing the configurations of samples 14 to 23 used in the stress analysis simulation.

FIG. 11 is a graph showing strain distributions after elapse of one cycle for the samples 1, 2, and 17.

DESCRIPTION OF EMBODIMENT

Figure 1:
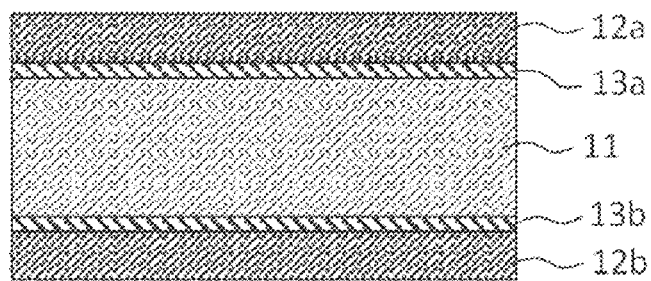
FIG. 1 is a longitudinal sectional view showing a schematic configuration of a layered bonding material according to an embodiment.

A layered bonding material according to a first aspect of an embodiment includes: a base material; a first solder section stacked on a first surface of the base material; and a second solder section stacked on a second surface of the base material. A coefficient of linear expansion of the base material is 5.5 to 15.5 ppm/K, the first solder section and the second solder section are made of lead-free solder, and both of a thickness of the first solder section and a thickness of the second solder section are 0.05 to 1.0 mm.

When the present inventors performed verification with a thermal cycle test and a stress analysis simulation, it was confirmed that, according to such an aspect, it is possible to relax a strain that occurs in a bonding section, in particular, under a high-temperature environment and achieve high reliability. According to the idea of the present inventors, the coefficient of linear expansion of the base material is present in the middle between a coefficient of linear expansion of a semiconductor device and a coefficient of linear expansion of a material of a substrate and a heat radiating section and is balanced and the lead-free solder has appropriate thickness. Therefore, it is considered possible to, without particularly relying on specific alloy compositions of a base material and a solder, relax a strain that occurs in the bonding section due to a CTE difference between the semiconductor device and the substrate, in particular, under a high-temperature environment.

A layered bonding material according to a second aspect of the embodiment is the layered bonding material according to the first aspect, wherein the lead-free solder has a Young's modulus of 45 GPa or higher and tensile strength of 100 MPa or lower.

When the present inventors actually performed verification with the thermal cycle test, it was found that, as the Young's modulus of the lead-free solder is larger, an effect of relaxing a strain that occurs in the bonding section on the substrate side is higher and, as the tensile strength of the lead-free solder is smaller, an effect of relaxing a strain that occurs in the bonding section on the semiconductor device side is higher. It was confirmed that, according to such an aspect, it is possible to effectively relax strains that occur in the bonding section on both the substrate side and the semiconductor device side, in particular, under a high-temperature environment and achieve high reliability.

A layered bonding material according to a third aspect of the embodiment is the layered bonding material according to the second aspect, wherein the Young's modulus of the lead-free solder is 55 GPa or higher.

When the present inventors actually performed verification with the thermal cycle test, it was confirmed that, according to such an aspect, it is possible to more effectively relax the strains that occur in the bonding section on both of the substrate side and the semiconductor device side and achieve extremely high reliability.

A layered bonding material according to a fourth aspect of the embodiment is the layered bonding material according to any one of the first to third aspects, wherein the base material has a mesh shape with a lattice interval of 2.0 mm or larger.

When the present inventors performed verification with the stress analysis simulation, it was confirmed that, according to such an aspect, it is possible to further improve the stress relaxation effect in the bonding section compared with when the base material is formed in a solid state.

A layered bonding material according to a fifth aspect of the embodiment is the layered bonding material according to any one of the first to fourth aspects, wherein the coefficient of linear expansion of the base material is 5.9 to 14.4 ppm/K.

When the present inventors actually performed verification with the thermal cycle test, it was confirmed that, according to such an aspect, it is possible to relax a strain that occurs in the bonding section on the semiconductor device side, in particular, under a high-temperature environment and achieve high reliability.

A layered bonding material according to a sixth aspect of the embodiment is the layered bonding material according to the fifth aspect, wherein the coefficient of linear expansion of the base material is 7.0 to 11.6 ppm/K.

When the present inventors actually performed verification with the thermal cycle test, it was confirmed that, according to such an aspect, an effect of relaxing a strain that occurs in the bonding section on the substrate side is higher and it is possible to achieve higher reliability.

A layered bonding material according to a seventh aspect of the embodiment is the layered bonding material according to the third aspect, wherein the coefficient of linear expansion of the base material is 7.7 to 9.9 ppm/K.

When the present inventors actually performed verification with the thermal cycle test, it was found that, according to such an aspect, progress of a crack in the bonding section was hardly confirmed on both of the substrate side and the semiconductor device side. Therefore, it was found that extremely high reliability can be achieved.

A layered bonding material according to an eighth aspect of the embodiment is the layered bonding material according to any one of the first to seventh aspects, wherein the base material is made of any one of a Cu—W-based material, a Cu—Mo-based material, a layered material of the Cu—W-based material and the Cu—Mo-based material, a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material.

According to such an aspect, since the base material has high thermal conductivity, it is possible to prevent an excessive temperature rise in the bonding section, a thermal strain itself that occurs in the bonding section is reduced, and, as a result, this more advantageously acts on the extension of the life of a product.

A layered bonding material according to a ninth aspect of the embodiment is the layered bonding material according to any one of the first to eighth aspects, wherein a Cu content of the base material is 60% or lower.

According to such an aspect, since the coefficient of linear expansion of the base material is lower, it is possible to further relax a strain that occurs in the bonding section due to the CTE difference, in particular, under a high-temperature environment.

A layered bonding material according to a tenth aspect of the embodiment is the layered bonding material according to any one of the first to ninth aspects, wherein a Cu content of the base material is 15% or higher.

According to such an aspect, since the thermal conductivity of the base material is further improved, a thermal strain itself that occurs in the bonding section can be further reduced.

A layered bonding material according to an eleventh aspect of the embodiment is the layered bonding material according to any one of the first to tenth aspects, wherein an interface between at least one of the first solder section and the second solder section and the base material is undercoated with Ni and Sn in order from the base material side.

According to such an aspect, it is possible to improve adhesion of the base material and the lead-free solder.

A layered bonding material according to a twelfth aspect of the embodiment is the layered bonding material according to any one of the first to eleventh aspects, wherein at least one of a ratio of thicknesses of the base material and the first solder section and a ratio of thicknesses of the base material and the second solder section is 2:1 to 10:1.

A layered bonding material according to a thirteenth aspect of the embodiment is the layered bonding material according to any one of the first to twelfth aspects, wherein a melting point of the lead-free solder is 210° C. or higher. The melting point of the lead-free solder may be 230° C. or higher.

According to such an aspect, even when the temperature of the layered bonding material reaches high temperature equal to or higher than 200° C. because of a rise in an operating temperature of the semiconductor device, the lead-free solder included in the layered bonding material can be prevented from melting to cause a breakdown.

A semiconductor package according to a fourteenth aspect of the embodiment includes: a substrate; a semiconductor device disposed on the substrate; and a layered bonding material disposed between the substrate and the semiconductor device and bonding the substrate and the semiconductor device, wherein the layered bonding material includes: a base material; a first solder section stacked on a first surface of the base material; and a second solder section stacked on a second surface of the base material, a coefficient of linear expansion of the base material is 5.5 to 15.5 ppm/K, the first solder section and the second solder section are made of lead-free solder, and both of a thickness of the first solder section and a thickness of the second solder section are 0.05 to 1.0 mm.

A semiconductor package according to a fifteenth aspect of the embodiment includes: a substrate; a semiconductor device disposed on the substrate; a first layered bonding material disposed between the substrate and the semiconductor device and bonding the substrate and the semiconductor device; a heat radiating section disposed on an opposite side of the semiconductor device on the substrate; and a second layered bonding material disposed between the substrate and the heat radiating section and bonding the substrate and the heat radiating section, wherein at least one of the first layered bonding material and the second layered bonding material includes: a base material; a first solder section stacked on a first surface of the base material; and a second solder section stacked on a second surface of the base material, a coefficient of linear expansion of the base material is 5.5 to 15.5 ppm/K, the first solder section and the second solder section are made of lead-free solder, and both of a thickness of the first solder section and a thickness of the second solder section are 0.05 to 1.0 mm.

A power module according to a sixteenth aspect of the embodiment includes: a substrate; a power semiconductor device disposed on the substrate; and a layered bonding material disposed between the substrate and the power semiconductor device and bonding the substrate and the power semiconductor device, wherein the layered bonding material includes: a base material; a first solder section stacked on a first surface of the base material; and a second solder section stacked on a second surface of the base material, a coefficient of linear expansion of the base material is 5.5 to 15.5 ppm/K or lower, the first solder section and the second solder section are made of lead-free solder, and both of a thickness of the first solder section and a thickness of the second solder section are 0.05 to 1.0 mm.

A power module according to a seventeenth aspect of the embodiment includes: a substrate; a power semiconductor device disposed on the substrate; a first layered bonding material disposed between the substrate and the power semiconductor device and bonding the substrate and the power semiconductor device; a heat radiating section disposed on an opposite side of the power semiconductor device on the substrate; and a second layered bonding material disposed between the substrate and the heat radiating section and bonding the substrate and the heat radiating section, wherein at least one of the first layered bonding material and the second layered bonding material includes: a base material; a first solder section stacked on a first surface of the base material; and a second solder section stacked on a second surface of the base material, a coefficient of linear expansion of the base material is 5.5 to 15.5 ppm/K or lower, the first solder section and the second solder section are made of lead-free solder, and both of a thickness of the first solder section and a thickness of the second solder section are 0.05 to 1.0 mm.

A specific example of the embodiment is explained in detail below with reference to the accompanying drawings. Note that, in the following explanation and the drawings referred to in the following explanation, the same reference numerals and signs are used for portions that can be configured the same. Redundant explanation of the portions is omitted. In the following explanation and the drawings referred to in the following explanation, concerning description of a solder composition, a numerical value before an element represents a mass composition (mass %) and SnBal. represents "balance Sn". For example, contents of constituent elements in a solder alloy described as "3.0Ag-0.5Cu-SnBal." are, when the entire solder alloy is 100 mass %, Ag:3.0 mass %, Cu: 0.5 mass %, and Sn:balace. Note that, in this specification, "tensile strength" is a value measured at the room temperature by a test method specified in JIS Z2241:2011.

(Layered Bonding Material)

FIG. 1 is a longitudinal sectional view showing a schematic configuration of a layered bonding material 10 according to the embodiment.

As shown in FIG. 1, the layered bonding material 10 includes a base material 11, a first solder section 12a stacked on a first surface of the base material 11, and a second solder section 12b stacked on a second surface of the base material 11.

The base material 11 is made of a material having a coefficient of linear expansion of 5.5 to 15.5 ppm/K. The base material 11 more preferably has a coefficient of linear expansion of 5.9 to 14.4 ppm/K and particularly preferably has a coefficient of linear expansion of 7.0 to 11.6 ppm/K. Specifically, for example, a Cu—W-based material or a Cu—Mo-based material is used as the base material 11. A layered material of the Cu—W-based material and the Cu—Mo-based material may be used as the base material 11. As the base material 11, any one of a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material may be used. When the base material 11 is made of the composite material, a ratio of thicknesses of the Cu—Mo-based material, the Cu—W-based material, or the layered material of the Cu—W-based material and the Cu—Mo-based material located in the center and the Cu-based material stacked on one surface thereof may be, for example, 4:1 to 1:2.

Note that, in this specification, the Cu—W-based material means a material having the largest contents of Cu and W in a mass ratio among elements constituting the material. A total of the contents of Cu and W is preferably 50% or higher in a mass ratio with respect to the entire material. The Cu—W-based material may include elements other than Cu and W as impurities. The Cu—Mo-based material means a material having the largest contents of Cu and Mo in a mass ratio among elements constituting the material. A total of the contents of Cu and Mo is preferably 50% or higher in a mass ratio with respect to the entire material. The Cu—Mo-based material may include elements other than Cu and Mo as impurities.

Since a coefficient of thermal expansion increases when the Cu content of the base material 11 increases, the Cu content of the base material 11 is preferably 60% or lower in a mass ratio.

Since thermal conductivity is improved when the Cu content of the base material 11 increases, the Cu content of the base material 11 is preferably 15% or higher in a mass ratio.

The base material 11 may be formed in a solid state (in which an opening in a regular pattern is not formed) or may have a mesh shape (in which an opening is formed in a regular pattern). In the case of the mesh shape, a lattice interval (a center interval of two openings adjacent to each other) may be 1.0 mm or larger or may be 2.0 mm or larger. When the present inventors performed verification with a stress analysis simulation, it was confirmed that, according to such an aspect, it is possible to further improve a stress relaxation effect in the bonding section compared with when the base material 11 is formed in a solid state. This is considered to be because, since a ratio of a corner portion of a material to be bonded (for example, a semiconductor device 22 (see FIG. 2)) overlapping an opening portion of a mesh of the base material 11 increases as the lattice interval is larger, it is possible to improve the stress relaxation effect at the corner portion where a strain tends to occur.

As shown in FIG. 1, the first solder section 12a is stacked on the first surface (in an illustrated example, the upper surface) of the base material 11 and the second solder section 12b is stacked on the second surface (in the illustrated example, the lower surface) of the base material 11. Both of the first solder section 12a and the second solder section 12b are made of lead-free solder.

Both of the thickness of the first solder section 12a and the thickness of the second solder section 12b may be 0.05 to 1.0 mm or may be 0.1 to 1.0 mm.

A material of the lead-free solder constituting the first solder section 12a and the second solder section 12b is not particularly limited. For example, an Sn-based alloy, an Sn—Ag-based alloy, an Sn—Cu-based alloy, an Sn—Sb-based alloy, an Sn—Ag—Cu-based alloy, an Sn—Ag—Cu—Sb-based alloy, an Sn—Ag—Cu—In-based alloy, an Sn—Ag—Cu—Bi-based alloy, an Sn—Ag—Cu—Bi—Sb-based alloy, an Sn—Bi-based alloy, an Sn—In-based alloy, or the like may be used. Note that a ○○-based alloy (○○ is a chemical symbol of one or more types) means an alloy having the largest content of ○○ in a mass ratio among elements constituting the alloy. Preferably, a content of ○○ (when ○○ contains elements of two or more types, a total of contents of the elements) is 50% or higher in a mass ratio. The ○○-based alloy may contain elements other than ○○ as impurities.

The lead-free solder constituting the first solder section 12a and the lead-free solder 12b constituting the second solder section 12b may have the same composition or may have compositions different from each other.

Figure 2:
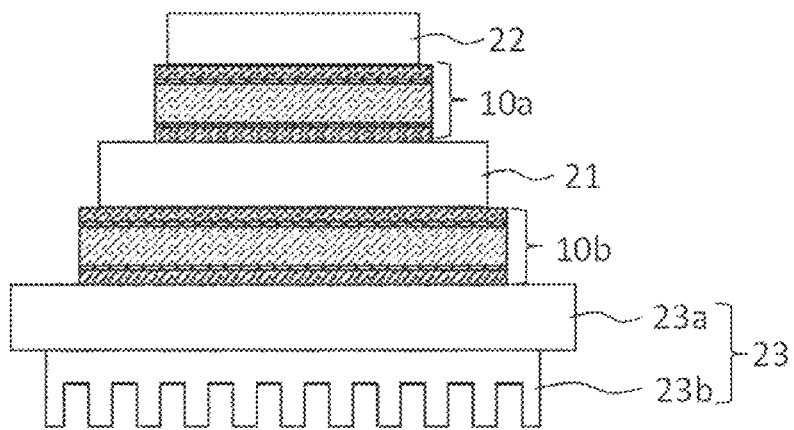
FIG. 2 is a longitudinal sectional view showing a schematic configuration of a semiconductor package according to the embodiment.

When the present inventors actually performed verification with the thermal cycle test, it was found that, with reference to FIG. 2, for a layered bonding material 10a disposed between a substrate 21 and a semiconductor device 22, as a Young's modulus of the lead-free solder constituting the first solder section 12a and the second solder section 12b is larger, an effect of relaxing a strain that occurs in the bonding section on the base material 11 side is higher and, as tensile strength of the lead-free solder is smaller, an effect of relaxing a strain that occurs in the bonding section on the semiconductor device 12 side is higher. Therefore, the lead-free solder constituting the first solder section 12a and the second solder section 12b preferably has a Young's modulus of 45 GPa or higher and tensile strength of 100 MPa (the middle of tensile strength 96.5 MPa of "3.4Ag-0.7Cu-3.2Bi-3.0Sb-0.025Fe-0.008Co-SnBal." and tensile strength 108.8 MPa of "10.0Ag-4.0Cu-20.0Sb-SnBal.") or higher and more preferably has a Young's modulus of 55 GPa (the middle of a Young's modulus 53.8 GPa of "10.0Sb-SnBal." and a Young's modulus 56.5 GPa of "0.7Cu-0.06Ni-0.003P-SnBal.") or higher. Further, when the Young's modulus of the lead-free solder is 55 GPa or higher, a coefficient of linear expansion of the base material 11 is more preferably 7.7 to 9.9 ppm/K. When the present inventors actually performed verification with the thermal cycle test, according to such an aspect, progress of a crack in the bonding section was hardly confirmed on both of the substrate 21 side and the semiconductor device 22 side. Therefore, it was found that extremely high reliability can be achieved.

When the present inventors performed verification with the stress analysis simulation, it was found that, as tensile strength of the lead-free solder constituting the first solder section 12a and the second solder section 12b is larger, it is possible to further improve the stress relaxation effect in the bonding section. Therefore, the tensile strength of the lead-free solder constituting the first solder section 12a and the second solder section 12b is preferably 53 MPa (tensile strength of "3.0Ag-0.5Cu-SnBal.") or higher and more preferably 58 MPa (tensile strength of "10.0Sb-SnBal.") or higher.

A melting point of the lead-free solder constituting the first solder section 12a and the second solder section 12b is preferably 210° C. or higher and may be 230° C. or higher, may be 240° C. or higher, or may be 250° C. or higher.

At least one of a ratio of thicknesses of the base material 11 and the first solder section 12a and a ratio of thicknesses of the base material 11 and the second solder section 12b is preferably 2:1 to 10:1. Both of the ratio of the thicknesses of the base material 11 and the first solder section 12a and the ratio of the thicknesses of the base material 11 and the second solder section 12b may be 2:1 to 10:1.

Stacking of the first solder section 12a and the second solder section 12b is performed by an existing method such as electroplating, hot dip plating, or clad. The thickness of coating may be adjusted by the clad or rolling.

As shown in FIG. 1, an interface between at least one of the first solder section 12a and the second solder section 12b and the base material 11 is preferably undercoated (for example, plated) with Ni and Sn in order from the base material 11 side. When Ni is undercoated between the base material 11 and Sn, it is possible to prevent diffusion of Sn to the base material 11 side. When Sn is undercoated on Ni, it is easy to stack the first solder 12a and the second solder section 12b made of the lead-free solder. Therefore, adhesion of the base material 11 and the first solder section 12a and the second solder section 12b made of the lead-free solder is improved. Interfaces between both of the first solder section 12a and the second solder section 12b and the base material 11 may be undercoated (for example, plated) with Ni and Sn in order from the base material 11 side.

In the illustrated example, a first undercoat layer 13a by undercoating is formed between the first surface of the base material 11 and the first solder section 12a made of the lead-free solder. A second undercoat layer 13b by undercoating is formed between the second surface of the base material 11 and the second solder section 12b made of the lead-free solder.

(Semiconductor Package, Power Module)

Subsequently, a semiconductor package 20 according to the embodiment is explained with reference to FIG. 2. Note that, in this specification, when the semiconductor device 22 included in the semiconductor package 20 is a power semiconductor device, such a semiconductor package 20 (that is, a power semiconductor package) is sometimes referred to as power module.

FIG. 2 is a longitudinal sectional view showing a schematic configuration of the semiconductor package 20 according to the embodiment.

As shown in FIG. 2, the semiconductor package 20 includes the substrate 21, the semiconductor device 22 disposed on the substrate 21, and a first layered bonding material 10a that bonds the substrate 21 and the semiconductor device 22.

The configuration of the first layered bonding material 10a is the same as the configuration of the layered bonding material 10 according to the embodiment explained above. Explanation of the configuration of the first layered bonding material 10a is omitted.

A type of the substrate 21 is not particularly limited. For example, a DBC (Direct Bonded Copper) substrate or a DBA (Direct Bonded Aluminum) substrate is used.

As shown in FIG. 2, the semiconductor device 22 is disposed on the substrate 21 via the first layered bonding material 10a. The substrate 21 and the semiconductor device 22 are bonded by the first layered bonding material 10a.

A type of the semiconductor device 22 is not particularly limited. For example, a power semiconductor device such as a power transistor or a power diode is used. In this case, even if the temperature of the first layered bonding material 10a reaches high temperature equal to or higher than 200° C. because of a rise in an operating temperature of the semiconductor device 22, if a melting point of the lead-free solder constituting the first solder section 12a and the second solder section 12b is 210° C. or higher in the first layered bonding material 10a, the lead-free solder can be prevented from melting to cause a breakdown.

In this embodiment, as shown in FIG. 2, the semiconductor package 20 further includes a heat radiating section 23 disposed under the substrate 21 and a second layered bonding material 10b that bonds the substrate 21 and the heat radiating section 23.

The configuration of the second layered bonding material 10b is the same as the configuration of the layered bonding material 10 according to the embodiment explained above. Explanation of the configuration of the second layered bonding material 10b is omitted.

As shown in FIG. 2, the heat radiating section 23 is disposed on the opposite side of the semiconductor device 22 on the substrate 21 via the second layered bonding material 10b. The substrate 21 and the heat radiating section 23 are bonded by the second layered bonding material 10b.

In an example shown in FIG. 2, the heat radiating section 23 includes a heat radiating plate 23a and a heat radiating fin 23b closely attached and fixed to one surface (in the illustrated example, the lower surface) of the heat radiating plate 23a. The other surface (in the illustrated example, the upper surface) of the heat radiating plate 23a is closely attached and fixed to the second layered bonding material 10b. As the material of the heat radiating section 23, a material having high thermal conductivity is used. For example, CuMo or CuW is used.

When the present inventors performed verification with a thermal cycle test and a stress analysis simulation explained below, it was confirmed that, according to this embodiment explained above, it is possible to relax a strain that occurs in a bonding section, in particular, under a high-temperature environment and achieve high reliability. According to the idea of the present inventors, a coefficient of linear expansion of the base material 11 included in the first layered bonding material 10a and the second layered bonding material 10b is present in the middle between a coefficient of linear expansion of the semiconductor device 22 and a coefficient of linear expansion of the material of the substrate 21 and the heat radiating section 23 and is balanced and the first solder section 12a and the second solder section 12b made of the lead-free solder have appropriate thicknesses. Therefore, it is considered possible to relax a strain that occurs in a bonding section between the semiconductor device 22 and the substrate 21 and a bonding section between the substrate 21 and the heat radiating section 23 because of a CTE difference between the semiconductor device 22 and the substrate 21 and the heat radiating section 23 under a high-temperature environment without particularly relying on specific alloy compositions of a base material and solder.

According to this embodiment, the base material 11 included in the first layered bonding material 10a and the second layered bonding material 10b is made of any one of a Cu—W-based material, a Cu—Mo-based material, a layered material of the Cu—W-based material and the Cu—Mo-based material, a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material. The base material 11 has high thermal conductivity. Therefore, it is possible to prevent an excessive temperature rise in the bonding section, a thermal strain itself that occurs in the bonding section is reduced, and, as a result, this more advantageously acts on the extension of the life of a product of the semiconductor package 20.

According to this embodiment, a Cu content of the base material 11 included in the first layered bonding material 10a and the second layered bonding material 10b is 60% or lower. Therefore, the coefficient of linear expansion of the base material 11 is lower. It is possible to further relax a strain that occurs in the bonding section due to the CTE difference, in particular, under a high-temperature environment.

According to this embodiment, a Cu content of the base material 11 included in the first layered bonding material 10a and the second layered bonding material 10b is 15% or higher. Therefore, the thermal conductivity of the base material 11 is improved and a thermal strain itself that occurs in the bonding section can be further reduced.

According to this embodiment, in the first layered bonding material 10a and the second layered bonding material 10b, the interface between at least one of the first solder section 12a and the second solder section 12b is undercoated with Ni and Sn in order from the base material 11 side. Therefore, it is possible to improve adhesion of the base material 11 and the first solder section 12a and the second solder section 12b made of the lead-free solder.

According to this embodiment, in the first layered bonding material 10a and the second layered bonding material 10b, the melting point of lead-free solder constituting the first solder section 12a and the second solder section 12b is 210° C. or higher. Therefore, even when the temperature of the first layered bonding material 10a and the second layered bonding material 10b reaches high temperature equal to or higher than 200° C. because of a rise in an operating temperature of the semiconductor device 22, the lead-free solder included in the first layered bonding material 10a and the second layered bonding material 10b can be prevented from melting to cause a breakdown.

EXAMPLES

Subsequently, specific examples according to this embodiment are explained.
(1) First Thermal Cycle Test As shown in FIG. 3A, FIG. 3B, and FIG. 4, the present inventors prepared bonding materials (6.5 mm square; a base material is in a solid state) of examples 1 to 23 and comparative examples 1 to 18 and created samples obtained by bonding a substrate (20 mm square; a Cu block having a thickness of 2 mm) and a semiconductor device (5.5 mm square; an Si chip having a thickness of 0.4 mm) using the bonding materials. Subsequently, the present inventors carried out a thermal cycle test for the samples using a thermal shock equipment TSA-71L-A (manufactured by Espec Corporation) under a test condition of −40° C. to +150° C. (exposure times of 0.5 h). The present inventors performed SAT observation for the samples at points in time before the thermal cycle test, after 250 cycles, after 500 cycles, and after 1000 cycles from each of an Si chip side and a Cu base side using an ultrasonic video device FineSAT FAS200II (manufactured by Hitachi Kenki Fine Tech Co., Ltd.), calculated a void area ratio of a bonding section from an SAT observation image, and evaluated a change ratio (a crack progress ratio) of the void area ratio. The crack progress ratio was calculated by the following Expression (1).

Crack progress ratio (%)={(void area ratio after1000cycles−void area ratio before thermal cycle test)/(100−void area ratio before thermal cycle test)}×100    Expression (1)

A row of the "crack progress ratio" in FIG. 3A, FIG. 3B, and FIG. 4 indicates a test result. In FIG. 3A, FIG. 3B, and FIG. 4, the crack progress ratio "⊚" indicates that the crack progress ratio on the Si chip side is lower than 10% and the crack progress ratio on the Cu base side is lower than 10%. The crack progress ratio "○" indicates that the crack progress ratio on the Si chip side is lower than 10% and the crack progress ratio on the Cu base side is 10% or higher and lower than 50%. The crack progress ratio "X" indicates that the crack progress ratio on the Si chip side is 10% or higher and the crack progress ratio on the Cu base side is 50% or higher.

Figure 5A:
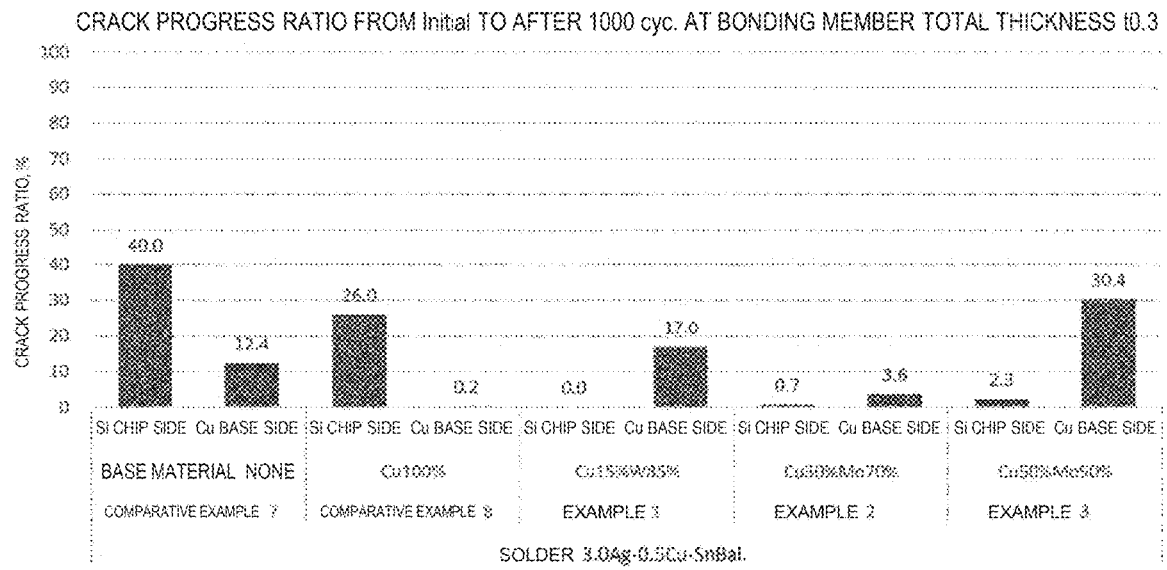
FIG. 5A is a bar graph showing crack progress ratios of examples 1 to 3 and comparative examples 7 and 8 in comparison.
Figure 5B:
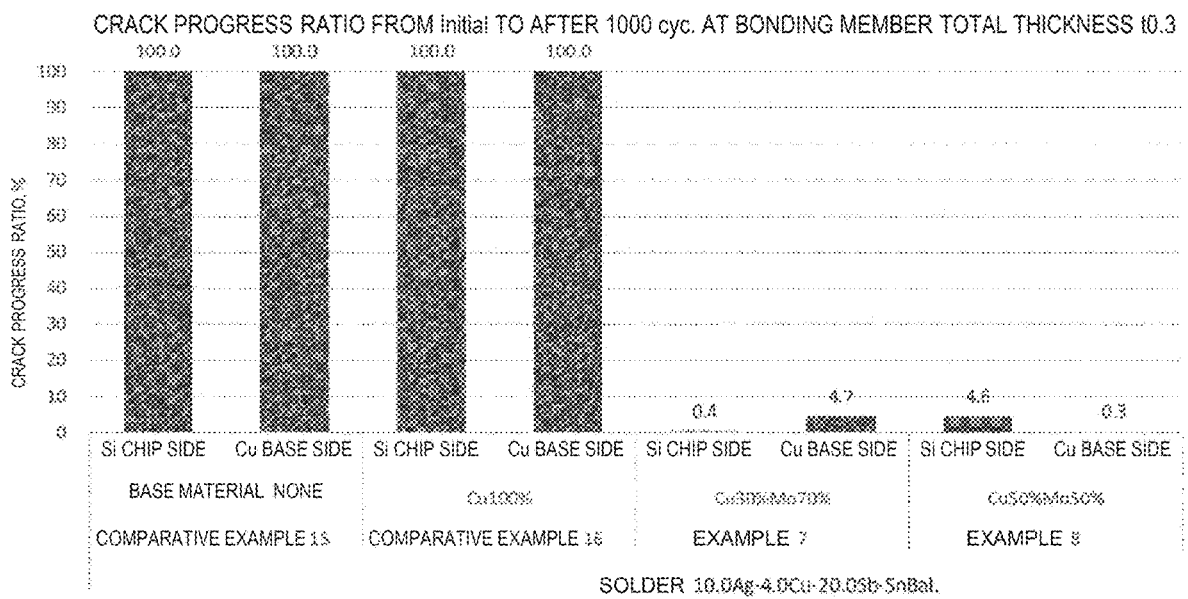
FIG. 5B is a bar graph showing crack progress ratios of examples 7 and 8 and comparative examples 15 and 16 in comparison.
Figure 6A:
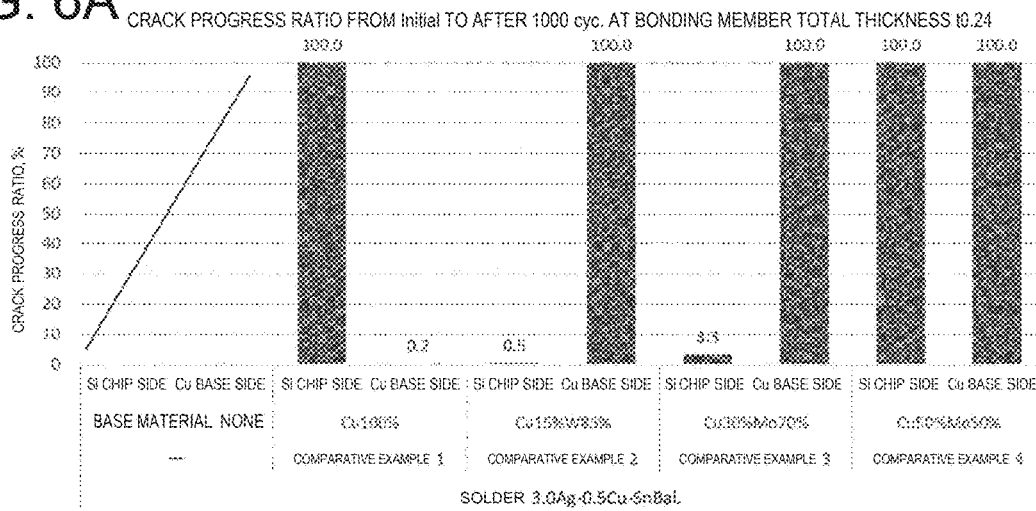
FIG. 6A is a bar graph showing crack progress ratios of comparative examples 1 to 4 in comparison.
Figure 6B:
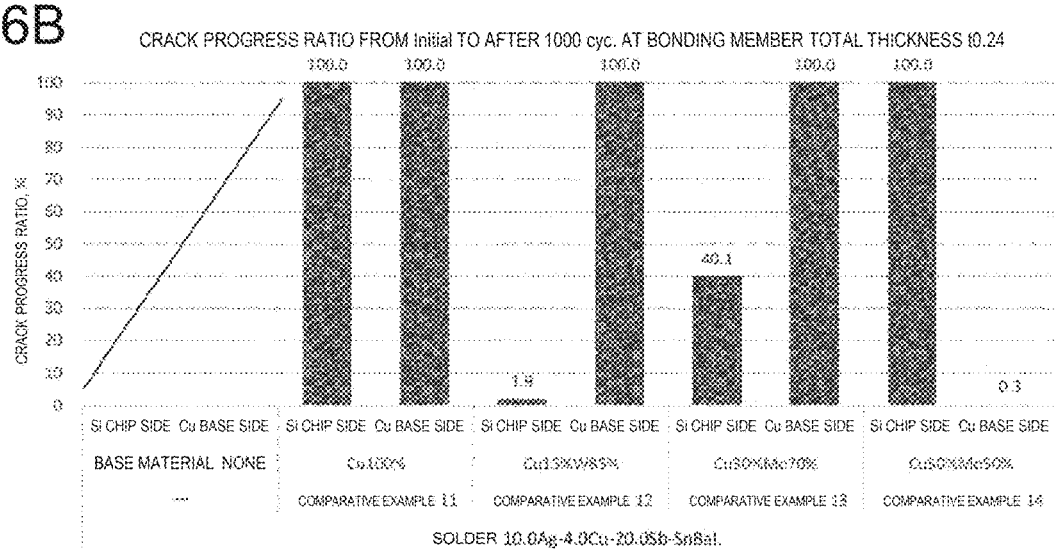
FIG. 6B is a bar graph showing crack progress ratios of comparative examples 11 to 14 in comparison.
Figure 7A:
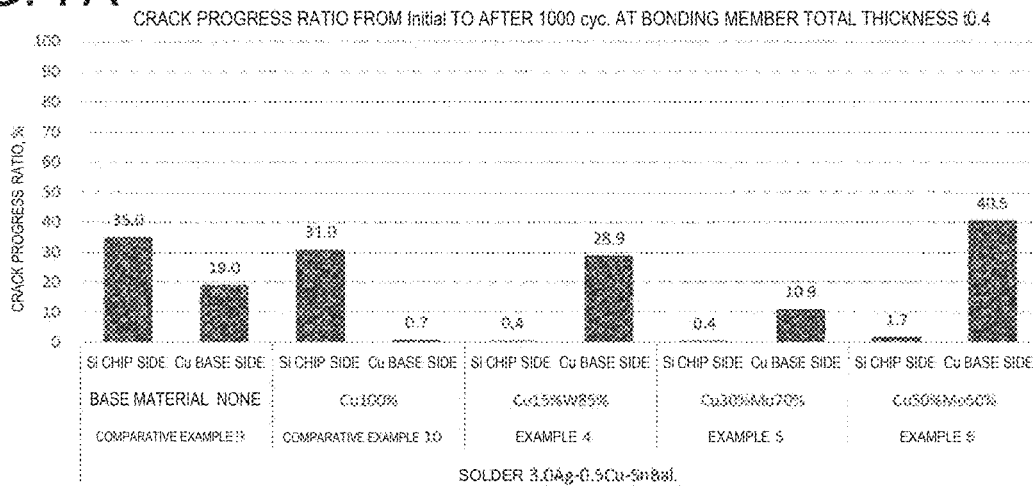
FIG. 7A is a bar graph showing crack progress ratios of examples 4 to 6 and comparative examples 9 and 10 in comparison.
Figure 7B:
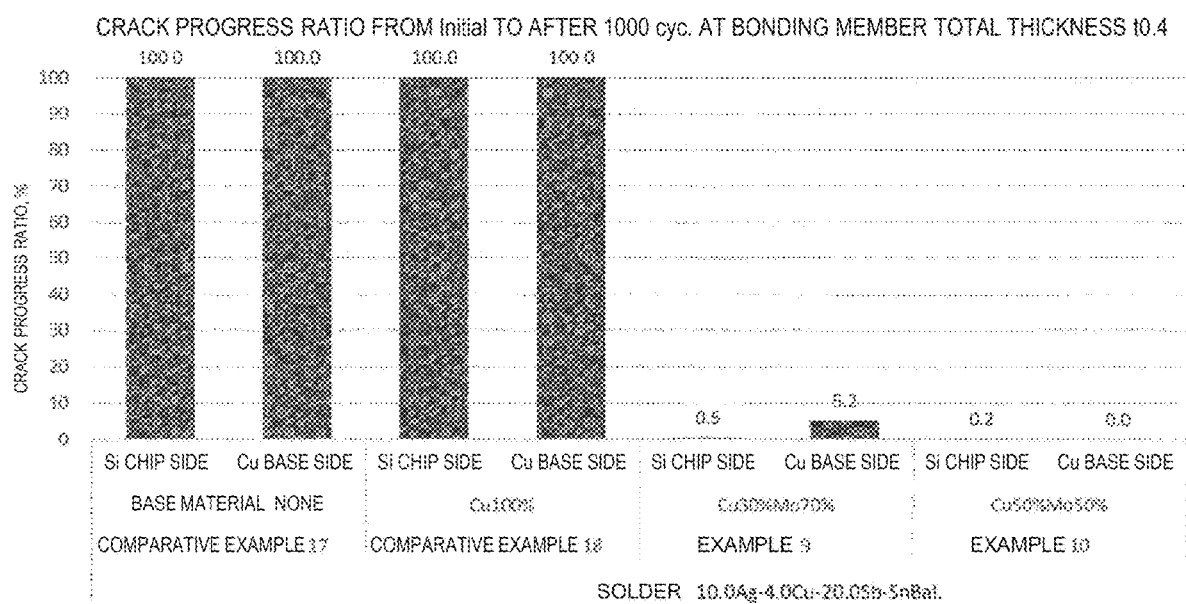
FIG. 7B is a bar graph showing crack progress ratios of examples 9 and 10 and comparative examples 17 and 18 in comparison.

FIG. 5A is a bar graph showing the crack progress ratios of the examples 1 to 3 and the comparative examples 7 and 8 in comparison. FIG. 5B is a bar graph showing the crack progress ratios of the examples 7 and 8 and the comparative examples 15 and 16 in comparison. FIG. 6A is a bar graph showing the crack progress ratios of the comparative examples 1 to 4 in comparison. FIG. 6B is a bar graph showing the crack progress ratios of the comparative examples 11 to 14 in comparison. FIG. 7A is a bar graph showing the crack progress ratios of the examples 4 to 6 and the comparative examples 9 and 10 in comparison. FIG. 7B is a bar graph showing the crack progress ratios of the examples 9 and 10 and the comparative examples 17 and 18 in comparison.

As shown in FIG. 3A, FIG. 3B, and FIG. 5A to FIG. 7B, in all of the examples 1 to 23, it was confirmed that the crack progress ratio on the Si chip side after 1000 cycles was lower than 10%, a strain that occurred in a bonding section on the Si chip side, in particular, under a high-temperature environment was successfully relaxed, and reliability was high. On the other hand, as shown in FIG. 4 and FIG. 5A to FIG. 7B, in the comparative examples 1, 4 to 11, and 13 to 18, it was confirmed that the crack progress ratio on the Si chip side after 1000 cycles was 10% or higher (in the comparative examples 1, 4, 11, and 14 to 18, 100%), a strain that occurred in the bonding section on the Si chip side, in particular, under a high-temperature environment was not successfully relaxed, and reliability was low. In the examples 1 to 23, a coefficient of linear expansion of a base material is 5.9 to 14.4 ppm/K. On the other hand, in the comparative examples 7, 9, 15, and 17, the base material is absent, in the comparative examples 1, 8, 10 and 11, 16, and 18, the coefficient of linear expansion of the base material is as high as 17.1 ppm/K, and, in the comparative examples 5 and 6, the coefficient of linear expansion of the base material is as low as 4.6 to 5.2 ppm/K. Therefore, in a layered bonding material obtained by stacking a first solder section and a second solder section made of lead-free solder on the first surface and the second surface of the base material, if a coefficient of linear expansion of the base material is 5.5 (the middle of 5.9 and 4.6) to 15.5 (the middle of 14.4 and 17.1) ppm/K, more preferably, 5.9 to 14.4 ppm/K, the crack progress ratio on the Si chip side after 1000 cycles is lower than 10%. It can be considered that it is possible to relax, in particular, a strain that occurs in the bonding section on the Si chip side and achieve high reliability.

As shown in FIG. 3A, FIG. 3B, and FIG. 5A to FIG. 7B, in the examples 2, 7 to 10, 13, 16, and 19, it was confirmed that the crack progress ratio on the Cu base side was lower than 10% and an effect of relaxing a strain that occurred in the bonding section on the Cu base side was higher. Whereas the coefficient of linear expansion of the base material is 7.0 to 11.6 ppm/K in the examples 1 to 10, 13 and 14, and 16 to 21, the coefficient of linear expansion of the base material is 5.9 to 6.8 ppm/K in the examples 11 and 12 and 15 and the coefficient of linear expansion of the base material is 13.8 to 14.4 ppm/K in the examples 22 and 23. Accordingly, in the layered bonding material in which the first solder section stacked on the first surface of the base material and the second solder section stacked on the second surface of the base material are made of the lead-free solder, in order to have a higher effect of relaxing a strain that occurs in the bonding section and achieve higher reliability, the coefficient of linear expansion of the base material is considered to be more preferably 7.0 to 11.6 ppm/K.

(2) Second Thermal Cycle Test

As shown in FIG. 8A and FIG. 8B, the present inventors prepared bonding materials (6.5 mm square; a base material is in a solid state) of examples B1 to B36 and created samples obtained by bonding a substrate (20 mm square; a Cu block having a thickness of 2 mm) and a semiconductor device (5.5 mm square; an Si chip having a thickness of 0.4 mm) using the bonding materials. Note that the samples in the examples B13 to B18 and B33 to B36 respectively correspond to the samples in the examples 1, 4, 2, 5, 3, 6, 7, 9, 8, and 10 in the first thermal cycle test. Subsequently, as in the first thermal cycle test, the present inventors carried out a thermal cycle test for the samples using a thermal shock equipment TSA-71L-A (manufactured by Espec Corporation) under a test condition of −40° C. to +150° C. (exposure times of 0.5 h). The present inventors performed SAT observation for the samples at points in time before the thermal cycle test and after 1000 cycles from each of an Si chip side and a Cu base side using an ultrasonic video device FineSAT FAS200II (manufactured by Hitachi Kenki Fine Tech Co., Ltd.), calculated a void area ratio of a bonding section from an SAT observation image, and evaluated a change ratio (a crack progress ratio) of the void area ratio.

A row of the "crack progress ratio" in FIG. 8A and FIG. 8B indicates a test result. In FIG. 8A and FIG. 8B, the crack progress ratio "A" indicates that the crack progress ratio on the Si chip side is lower than 10% and the crack progress ratio on the Cu base side is lower than 10%. The crack progress ratio "B" indicates that the crack progress ratio on the Si chip side is lower than 10% and the crack progress ratio on the Cu base side is 10% or higher and lower than 34%. The crack progress ratio "C" indicates that the crack progress ratio on the Si chip side is lower than 10% and the crack progress ratio on the Cu base side is 34% or higher and lower than 51%. The crack progress ratio "D" indicates that the crack progress ratio on the Si chip side is 10% or higher or the crack progress ratio on the Cu base side is 51% or higher. Note that a difference between the test results of the second thermal cycle test and the first thermal cycle test is considered to be because the number of tests was increased and the crack progress ratio was evaluated using average value data of the tests in the second thermal cycle test compared with the first thermal cycle test.

As shown in FIG. 8A and FIG. 8B, in all of the examples B1 to B24, it was confirmed that the crack progress ratio on the Si chip side after 1000 cycles was lower than 10% and the crack progress ratio on the Cu base side was 51% or lower, a strain that occurred in the bonding section on both of the Cu base side and the Si chip side, in particular, under a high-temperature environment was successfully relaxed, and high reliability was successfully achieved. Whereas the Young's modulus of the lead-free solder is 45 GPa or higher and the tensile strength of the lead-free solder is 97 MPa or lower in the examples B1 to B24, the Young's modulus of the lead-free solder is 45 GPa or higher and the tensile strength of the lead-free solder is 108 MPa or higher in the examples B25 to B36. Accordingly, in order to have a higher effect of relaxing a strain that occurs in the bonding section on both of the Cu base side and the Si chip side and achieve higher reliability, it can be considered that the Young's modulus of the lead-free solder is preferably 45 GPa or higher and the tensile strength of the lead-free solder is preferably 100 (the middle of 97 and 108) MPa or lower.

As shown in FIG. 8A, in all of the examples B19 to B24, it was confirmed that the crack progress ratio on the Si chip side after 1000 cycles was lower than 10% and the crack progress ratio on the Cu base side was lower than 34%, a strain that occurred in the bonding section on both of the Cu base side and the Si chip side, in particular, under a high-temperature environment was successfully relaxed, and extremely high reliability was successfully achieved. Whereas the Young's modulus of the lead-free solder is 56 GPa or higher in the examples B19 to B24, the Young's modulus of the lead-free solder is 54 GPa or lower in the examples B1 to B18. Accordingly, in order to have a higher effect of relaxing a strain that occurs in the bonding section on both of the Cu base side and the Si chip side and achieve higher reliability, it can be considered that the Young's modulus of the lead-free solder is more preferably 55 (the middle of 54 and 56) GPa or higher.

Further, as shown in FIG. 8A, in all of the examples B21 to B24, it was confirmed that the crack progress ratio on the Si chip side after 1000 cycles was lower than 10% and the crack progress ratio on the Cu base side was lower than 10%, progress of a crack in the bonding section on both of the Cu base side and the Si chip side was hardly confirmed, and, therefore, extremely high reliability was successfully achieved. Whereas the coefficient of linear expansion of the base material is 7.7 to 9.9 ppm/K in the examples B21 to B24, the coefficient of linear expansion of the base material is 7.0 ppm/K in the examples B19 and B20. Accordingly, when the Young's modulus of the lead-free solder is 54 GPa or lower and the tensile strength of the lead-free solder is 100 MPa or lower, it can be considered that the coefficient of linear expansion of the base material is more preferably 7.7 to 9.9 ppm/K.

(3) Stress Analysis Simulation

The present inventors checked, with a computer simulation simulating the thermal cycle test explained above, whether a stress relaxation effect of a layered bonding material depends on thickness and a material of lead-free solder, a shape of a base material, and the like.

Figure 13A:
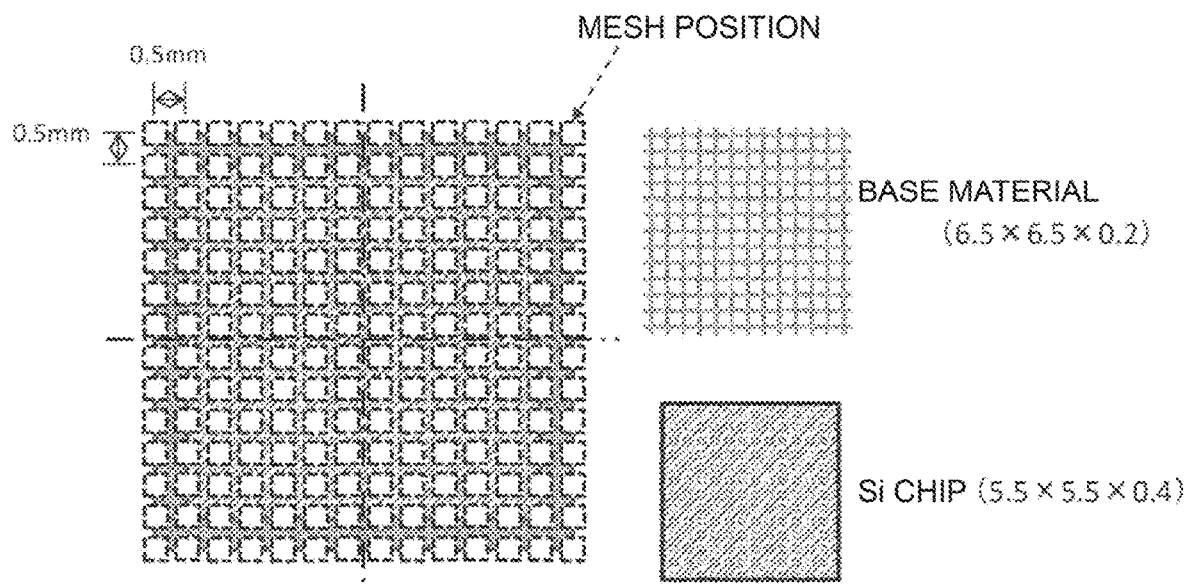
FIG. 13A is a diagram for explaining an example of a base material having a mesh shape.
Figure 13B:
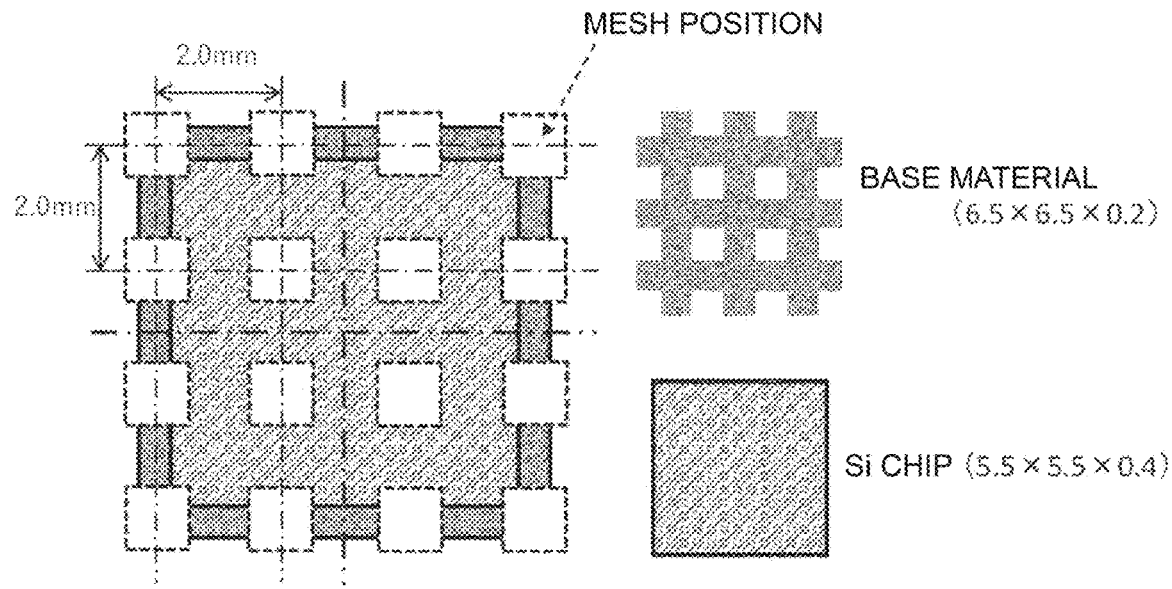
FIG. 13B is a diagram for explaining an example of a base material having a mesh shape.
Figure 13C:
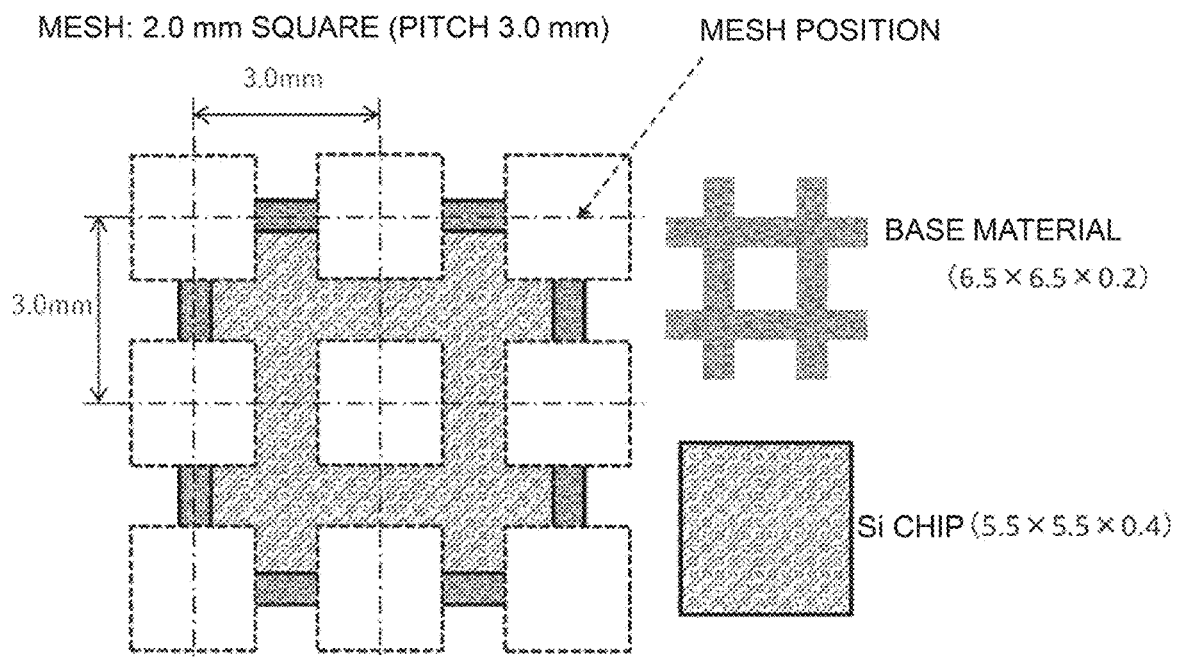
FIG. 13C is a diagram for explaining an example of a base material having a mesh shape.
Figure 13D:
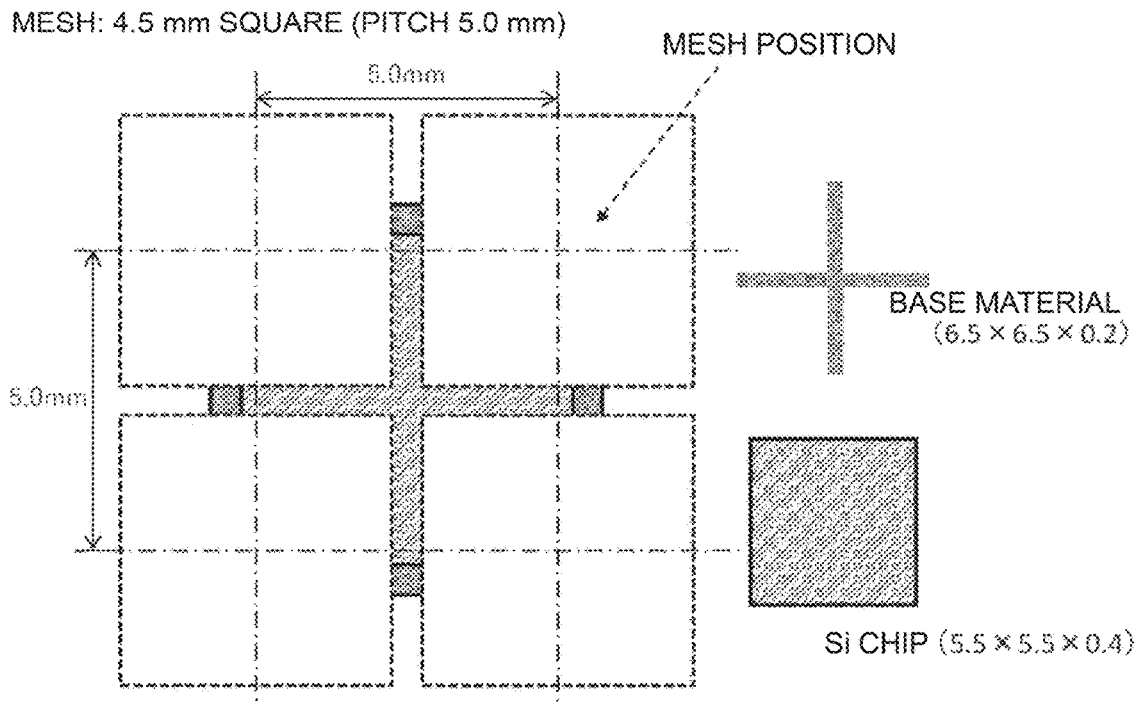
FIG. 13D is a diagram for explaining an example of a base material having a mesh shape.

That is, first, as shown in FIG. 10A and FIG. 10B, the present inventors defined bonding materials (6.5 mm square) of samples 1 to 23. In the samples 14 to 16, as shown in FIG. 13A, a base material has a mesh shape in which 0.35 mm square openings are formed in a lattice-like pattern (a center interval (pitch) of two openings adjacent to each other is 0.5 mm). Four corners of an Si chip, which is a material to be bonded, can overlap opening portions of the base material. In the samples 17 to 19, as shown in FIG. 13B, a base material has a mesh shape in which 1.0 mm square openings are formed in a lattice-like pattern (a center interval (pitch) of two openings adjacent to each other is 2.0 mm). Four corners of an Si chip, which is a material to be bonded, can overlap opening portions of the base material. In the samples 20 and 21, as shown in FIG. 13C, a base material has a mesh shape in which 2.0 mm square openings are formed in a lattice-like pattern (a center interval (pitch) of two openings adjacent to each other is 3.0 mm). Four corners of an Si chip, which is a material to be bonded, can overlap opening portions of the base material. In the samples 22 and 23, as shown in FIG. 13D, a base material has a mesh shape in which 4.5 mm square openings are formed in a lattice-like pattern (a center interval (pitch) of two openings adjacent to each other is 5.0 mm). Four corners of an Si chip, which is a material to be bonded, can overlap opening portions of the base material.

Figure 9:
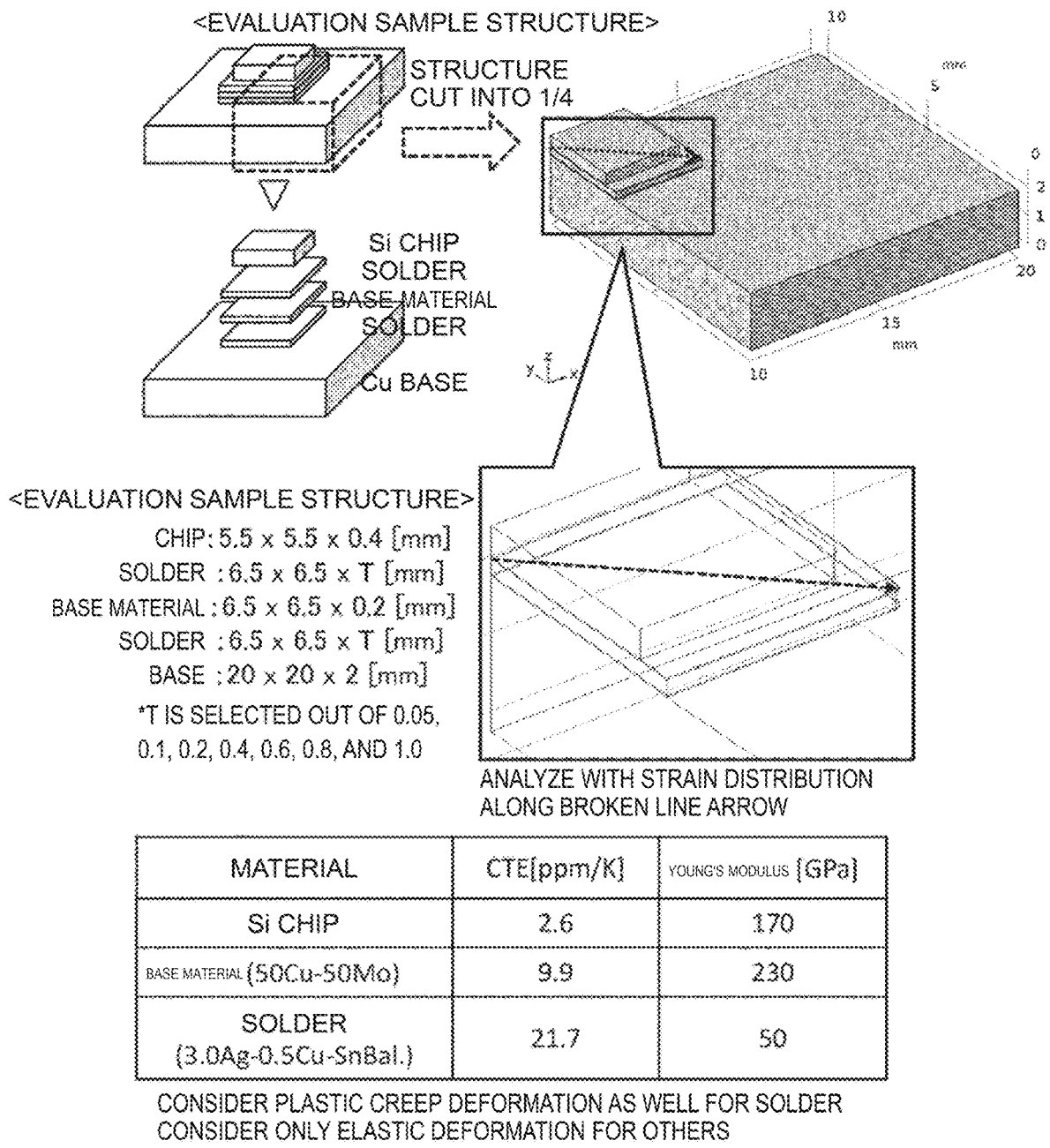
FIG. 9 is a diagram for explaining analysis conditions by a simulation.

Subsequently, the present inventors used physical simulation software (COMSOL Multiphysics (registered trademark) Ver. 5.5 manufactured by COMOSOL AB), created evaluation samples obtained by bonding a substrate (20 mm square; a Cu block having a thickness of 2 mm) and a semiconductor device (5.5 mm square; an Si chip having a thickness of 0.4 mm) using bonding materials as shown in FIG. 9, performed a simulation (a calculation method (an algorithm) is a finite element method analysis with a solder section as a viscoplastic body and the other as a perfect elastic body) of a thermal cycle test for the evaluation samples under a test condition of −40° C. to +150° C. (exposure times of 0.5 h), and measured a strain distribution that occurs in interfaces on the substrate side and the semiconductor device side after elapse of one cycle. FIG. 11 is a graph showing strain distributions in an interface between the semiconductor device and the bonding member after elapse of one cycle for the samples 1, 2, and 17.

Figure 12:
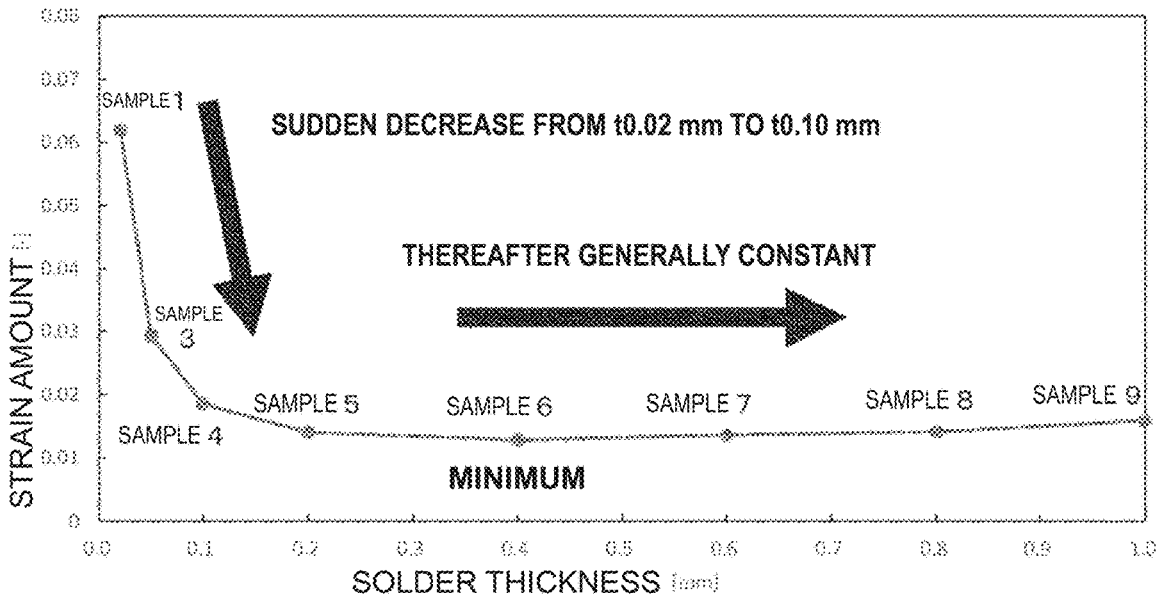
FIG. 12 is a graph showing strain amounts after elapse of one cycle for the samples 1 and 3 to 9.

FIG. 12 is a graph showing, with the thickness of the lead-free solder set on the horizontal axis, a strain amount (an average value of a strain distribution) in the interface between the semiconductor device and the bonding member after elapse of one cycle for the samples 1 and 3 to 9. As shown in FIG. 12, it was confirmed that, in a range in which the thickness of the solder was 0.02 to 0.1 mm, the strain amount suddenly decreases as the thickness of the solder increased and, in a range in which the thickness of the solder was 0.1 to 1.0 mm, the strain amount was generally constant irrespective of the thickness of the solder. Accordingly, it can be considered that the thickness of the lead-free solder in the layered bonding material is preferably 0.05 to 1.0 mm.

Figure 14:
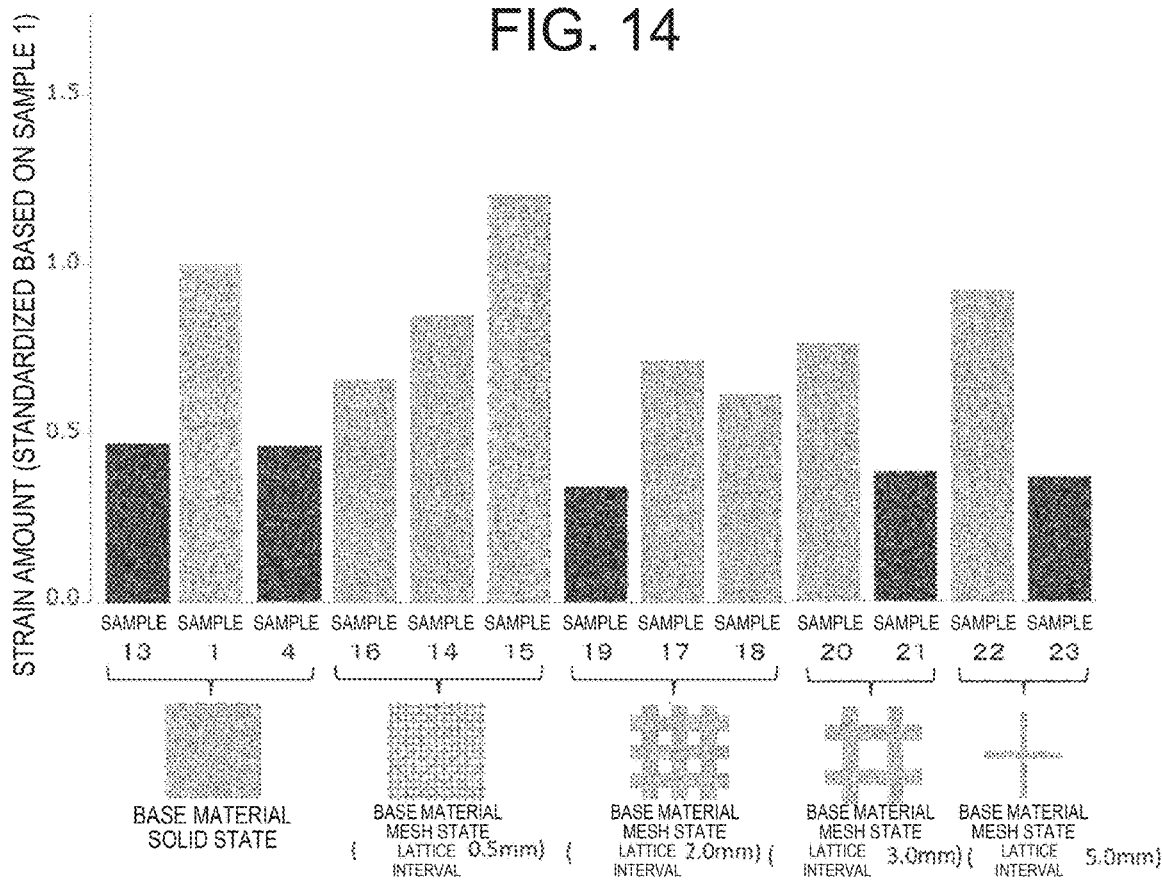
FIG. 14 is a bar graph showing strain amounts after elapse of one cycle for the samples 1, 4, and 13 to 23.

FIG. 14 is a bar graph showing strain amounts (maximum values of strain distributions) in the interface between the semiconductor device and the bonding member after elapse of one cycle for the samples 1, 4, and 13 to 23, the strain amounts being standardized based on the strain amount of the sample 1. As shown in FIG. 14, it was confirmed that, when the base material had the mesh shape (the lattice interval is 2.0 mm) (the samples 17 to 19), the strain amounts generally decreased compared with when the base material was formed in the solid state (the samples 1, 4, and 13) and, when the base material has the mesh shape (the lattice interval is 3.0 mm or 5.0 mm) (the samples 20 to 23), the strain amounts clearly decreased compared with when the base material is formed in the solid state. Accordingly, when the base material has the mesh shape, if the lattice interval is 1.0 mm (the middle of the samples 14 to 16 and the samples 17 to 19) or larger or 2.0 mm (the samples 17 to 19) or larger, it can be considered that the stress relaxation effect in the bonding section can be further improved compared with when the base material is formed in the solid state.

The embodiment and the modifications are explained above by illustration. However, the scope of the present technique is not limited to the embodiment and the modifications and can be changed and modified according to a purpose within the scope described in claims. The embodiment and the modifications can be combined as appropriate in a range in which processing contents do not contradict.

The invention claimed is:

1. A layered bonding material comprising:
a base material;
a first solder section stacked on a first surface of the base material; and
a second solder section stacked on a second surface of the base material, wherein
a coefficient of linear expansion of the base material is 5.5 to 15.5 ppm/K,
the first solder section and the second solder section are made of lead-free solder, and
both of a thickness of the first solder section and a thickness of the second solder section are 0.05 to 1.0 mm.

2. The layered bonding material according to claim 1, wherein the lead-free solder has a Young's modulus of 45 GPa or higher and tensile strength of 100 MPa or lower.

3. The layered bonding material according to claim 2, wherein the Young's modulus of the lead-free solder is 55 GPa or higher.

4. The layered bonding material according to claim 1, wherein the base material has a mesh shape with a lattice interval of 2.0 mm or larger.

5. The layered bonding material according to claim 1, wherein the coefficient of linear expansion of the base material is 5.9 to 14.4 ppm/K.

6. The layered bonding material according to claim 5, wherein the coefficient of linear expansion of the base material is 7.0 to 11.6 ppm/K.

7. The layered bonding material according to claim 3, wherein the coefficient of linear expansion of the base material is 7.7 to 9.9 ppm/K.

8. The layered bonding material according to claim 1, wherein the base material is made of any one of a Cu—W-based material, a Cu—Mo-based material, a layered material of the Cu—W-based material and the Cu—Mo-based material, a composite material obtained by stacking a Cu-based material on both of a first surface and a second surface of the Cu—W-based material, a composite material obtained by stacking the Cu-based material on both of a first surface and a second surface of the Cu—Mo-based material, and a composite material obtained by stacking the Cu-based material on both of a first surface and a second surface of the layered material of the Cu—W-based material and the Cu—Mo-based material.

9. The layered bonding material according to claim 1, wherein a Cu content of the base material is 60% or lower.

10. The layered bonding material according to claim 1, wherein a Cu content of the base material is 15% or higher.

11. The layered bonding material according to claim 1, wherein an interface between at least one of the first solder section and the second solder section and the base material is undercoated with Ni and Sn in order from the base material side.

12. The layered bonding material according to claim 1, wherein at least one of a ratio of thicknesses of the base material and the first solder section and a ratio of thicknesses of the base material and the second solder section is 2:1 to 10:1.

13. The layered bonding material according to claim 1, wherein a melting point of the lead-free solder is 210° C. or higher.

14. The layered bonding material according to claim 1, wherein a melting point of the lead-free solder is 230° C. or higher.

15. A semiconductor package comprising:
a substrate;
a semiconductor device disposed on the substrate; and
a layered bonding material disposed between the substrate and the semiconductor device and bonding the substrate and the semiconductor device, wherein
the layered bonding material includes:
a base material;
a first solder section stacked on a first surface of the base material; and
a second solder section stacked on a second surface of the base material,
a coefficient of linear expansion of the base material is 5.5 to 15.5 ppm/K,
the first solder section and the second solder section are made of lead-free solder, and
both of a thickness of the first solder section and a thickness of the second solder section are 0.05 to 1.0 mm.

16. A semiconductor package comprising:
a substrate;
a semiconductor device disposed on the substrate;
a first layered bonding material disposed between the substrate and the semiconductor device and bonding the substrate and the semiconductor device;
a heat radiating section disposed on an opposite side of the semiconductor device on the substrate; and
a second layered bonding material disposed between the substrate and the heat radiating section and bonding the substrate and the heat radiating section, wherein
at least one of the first layered bonding material and the second layered bonding material includes:
a base material;
a first solder section stacked on a first surface of the base material; and
a second solder section stacked on a second surface of the base material,
a coefficient of linear expansion of the base material is 5.5 to 15.5 ppm/K,
the first solder section and the second solder section are made of lead-free solder, and
both of a thickness of the first solder section and a thickness of the second solder section are 0.05 to 1.0 mm.

17. A power module comprising:
a substrate;
a power semiconductor device disposed on the substrate; and
a layered bonding material disposed between the substrate and the power semiconductor device and bonding the substrate and the power semiconductor device, wherein
the layered bonding material includes:
a base material;
a first solder section stacked on a first surface of the base material; and
a second solder section stacked on a second surface of the base material,
a coefficient of linear expansion of the base material is 5.5 to 15.5 ppm/K,
the first solder section and the second solder section are made of lead-free solder, and
both of a thickness of the first solder section and a thickness of the second solder section are 0.05 to 1.0 mm.

18. A power module comprising:
a substrate;
a power semiconductor device disposed on the substrate;
a first layered bonding material disposed between the substrate and the power semiconductor device and bonding the substrate and the power semiconductor device;
a heat radiating section disposed on an opposite side of the power semiconductor device on the substrate; and
a second layered bonding material disposed between the substrate and the heat radiating section and bonding the substrate and the heat radiating section, wherein
at least one of the first layered bonding material and the second layered bonding material includes:
a base material;
a first solder section stacked on a first surface of the base material; and
a second solder section stacked on a second surface of the base material,
a coefficient of linear expansion of the base material is 5.5 to 15.5 ppm/K,
the first solder section and the second solder section are made of lead-free solder, and
both of a thickness of the first solder section and a thickness of the second solder section are 0.05 to 1.0 mm.

* * * * *